US009093287B2

(12) United States Patent
Ko et al.

(10) Patent No.: US 9,093,287 B2
(45) Date of Patent: Jul. 28, 2015

(54) DIODE, ESD PROTECTION CIRCUIT AND METHOD OF MANUFACTURING THE SAME

(71) Applicant: SAMSUNG ELECTRONICS CO., LTD., Suwon-si, Gyeonggi-do (KR)

(72) Inventors: Jae-Hyok Ko, Gyeonggi-do (KR); Han-Gu Kim, Gyeonggi-do (KR); Min-Chang Ko, Gyeonggi-do (KR); Chang-Su Kim, Gyeonggi-do (KR); Kyoung-Ki Jeon, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/082,742

(22) Filed: Nov. 18, 2013

(65) Prior Publication Data
US 2014/0210003 A1     Jul. 31, 2014

(30) Foreign Application Priority Data
Jan. 25, 2013    (KR) .................. 10-2013-0008397

(51) Int. Cl.
| | |
|---|---|
| *H01L 29/66* | (2006.01) |
| *H01L 27/06* | (2006.01) |
| *H01L 21/8234* | (2006.01) |
| *H01L 27/07* | (2006.01) |
| *H01L 27/02* | (2006.01) |
| *H01L 29/861* | (2006.01) |

(52) U.S. Cl.
CPC .... *H01L 27/0629* (2013.01); *H01L 21/823418* (2013.01); *H01L 27/0255* (2013.01); *H01L 27/0705* (2013.01); *H01L 29/8611* (2013.01)

(58) Field of Classification Search
CPC ............ H01L 27/0255; H01L 27/0705; H01L 27/0629; H01L 29/8611; H01L 21/823418
See application file for complete search history.

(56) References Cited

U.S. PATENT DOCUMENTS

| | | | |
|---|---|---|---|
| 5,068,700 A * | 11/1991 | Yamaguchi et al. .......... | 257/212 |
| 5,744,830 A * | 4/1998 | Ekkanath-Madathil et al. ............................ | 257/140 |
| 6,507,469 B2 | 1/2003 | Andoh | |
| 6,707,104 B2 | 3/2004 | Watanabe et al. | |
| 6,861,680 B2 | 3/2005 | Ker et al. | |
| 6,898,060 B2 | 5/2005 | Juliano et al. | |
| 7,141,484 B2 | 11/2006 | Ker et al. | |
| 7,382,593 B2 | 6/2008 | Miske et al. | |

(Continued)

FOREIGN PATENT DOCUMENTS

| | | |
|---|---|---|
| JP | 2001-358297 | 12/2001 |
| JP | 2006-344704 | 12/2006 |
| KR | 100487413 | 4/2006 |

*Primary Examiner* — A. Sefer

(74) *Attorney, Agent, or Firm* — F. Chau & Associates, LLC

(57) ABSTRACT

A method of manufacturing a diode is provided. An N-type well region is formed in a first upper portion of an N-type epitaxial layer. A P-type drift region is formed in a second upper portion of the N-type epitaxial layer. An N-type doping region is formed in the N-type well region. A P-type doping region is formed in the P-type drift region. An isolation structure is formed in the P-type drift region. The isolation structure is disposed between the P-type doping region and the N-type well region. A first electrode is formed on a portion of the N-type epitaxial layer. The portion of the N-type epitaxial layer is disposed between the N-type well region and the P-type drift region. The first electrode overlaps a portion of the isolation structure. A connection structure is formed to electrically couple the N-type doping region and the first electrode.

16 Claims, 20 Drawing Sheets

(56) References Cited

U.S. PATENT DOCUMENTS

| | | |
|---|---|---|
| 7,466,006 B2 * | 12/2008 | Khemka et al. ............... 257/492 |
| 7,538,998 B2 | 5/2009 | Tsai et al. |
| 7,609,493 B1 | 10/2009 | Salman et al. |
| 7,679,870 B2 | 3/2010 | Lin et al. |
| 7,804,670 B2 | 9/2010 | Reynders et al. |
| 8,077,440 B2 | 12/2011 | Krabbenborg et al. |
| 8,742,534 B2 * | 6/2014 | Yamamoto et al. ............ 257/481 |
| 8,957,494 B2 * | 2/2015 | Gu ................................ 257/483 |
| 2006/0092592 A1 | 5/2006 | Huang |
| 2012/0049241 A1 | 3/2012 | Vashchenko |
| 2013/0300494 A1 * | 11/2013 | Mitsuda et al. ................ 327/436 |

* cited by examiner

2000a

DIODE, ESD PROTECTION CIRCUIT AND METHOD OF MANUFACTURING THE SAME

CROSS-REFERENCE TO RELATED APPLICATION

This application claims priority under 35 U.S.C. §119 to Korean Patent Application No. 10-2013-0008397, filed on Jan. 25, 2013 in the Korean Intellectual Property Office, the disclosure of which is incorporated by reference herein in its entirety.

TECHNICAL FIELD

The present inventive concept relates to a diode, an electrostatic discharge (ESD) protection circuit including the diode, and a method of manufacturing the same.

DISCUSSION OF THE RELATED ART

Lateral diffused metal oxide semiconductor (LDMOS) transistors have a rapid switching response and high input impedance, and thus the LDMOS transistors are widely used in a power device application. The thickness of the gate oxide of the LDMOS transistors is determined such that the potential difference between the gate and the source becomes about 5 volts when the potential difference between the gate and the drain is about tens of volts. Accordingly, the MOS capacitor using the gate oxide of the LDMOS transistor is not coupled directly between the gate and the drain of the LDMOS transistors to which a high voltage is applied to the gate.

SUMMARY

According to an exemplary embodiment of the present inventive concept, a diode includes an N-type well region, a P-type drift region, a cathode electrode, an anode electrode, and an isolation structure. The N-type well region is disposed in an N-type epitaxial layer. The P-type drift region is disposed in the N-type epitaxial layer and is spaced apart from the N-type well region. The cathode electrode includes a first electrode and an N-type doping region that is electrically coupled to the first electrode. The N-type well region includes the N-type doped region only and does not include a P-type doped region. The first electrode is disposed on the N-type epitaxial layer. The anode electrode includes a P-type doping region. The P-type doping region is disposed in the P-type drift region. The isolation structure is disposed in the P-type drift region and disposed between the N-type well region and the P-type doping region. The first electrode of the cathode overlaps part of the isolation structure. The first electrode corresponds to a gate of a P-type LDMOS transistor. The N-type well region, the P-type drift region, the P-type doping region, and the isolation structure of the diode corresponds to an N-type well region, a P-type drift region, a drain region, and an isolation structure of a P-type LDMOS transistor, respectively.

According to an exemplary embodiment of the present inventive concept, an electrostatic discharge (ESD) protection circuit includes an N-type lateral diffused metal oxide semiconductor (LDMOS) transistor, a diode, and a resistor. The N-type LDMOS transistor includes a gate, a source electrode, and a drain electrode. The source electrode is coupled to a first pad to which a first voltage is applied. The drain electrode is coupled to a second pad to which a second voltage higher than the first voltage is applied. The diode includes an N-type well region, a P-type drift region, a cathode electrode, an anode electrode, and an isolation structure. The cathode electrode is coupled to the second pad. The anode electrode is coupled to the gate of the N-type LDMOS transistor. The resistor includes a first terminal that is coupled to the gate of the N-type LDMOS transistor and a second terminal that is coupled to the first pad.

According to an exemplary embodiment of the present inventive concept, a method of manufacturing a diode is provided. An N-type well region is formed in a first upper portion of an N-type epitaxial layer. A P-type drift region is formed in a second upper portion of the N-type epitaxial layer. An N-type doping region is formed in the N-type well region. A P-type doping region is formed in the P-type drift region. An isolation structure is formed in the P-type drift region. The isolation structure is disposed between the P-type doping region and the N-type well region. A first electrode is formed on a portion of the N-type epitaxial layer. The portion of the N-type epitaxial layer is disposed between the N-type well region and the P-type drift region. The first electrode overlaps a portion of the isolation structure. A connection structure is formed to electrically couple the N-type doping region and the first electrode.

A first N-type well region of the diode and a second N-type well region of the PLDMOS are simultaneously formed in an N-type epitaxial layer. A first P-type drift region of the diode and a second P-type drift region of the PLDMOS are simultaneously formed in the N-type epitaxial layer. A first N-type doping region of the diode and a second N-type doping region of the PLDMOS are simultaneously formed in the first and the second N-type well region, respectively. The first N-type doping region is larger than the second N-type doping region. A second P-type doping region of the PLDMOS is formed in the second N-type well region. A corresponding first P-type doping region is not formed in the first N-type well region. A third P-type doping region of the diode and a fourth P-type doping region of the PLDMOS are simultaneously formed in the first and the second P-type drift region, respectively. A first isolation structure of the diode is formed in the first P-type drift region. A second isolation structure of the PLDMOS is simultaneously formed in the second P-type drift region. The first isolation structure is disposed between the first P-type doping region and the first N-type well region. The second isolation structure is disposed between the second P-type doping region and the second N-type well region. A first electrode of the diode and a gate of the PLDMOS are simultaneously formed on a first portion of the N-type epitaxial layer and a second portion of the N-type epitaxial layer, respectively. The first portion of the N-type epitaxial layer is disposed between the first N-type well region and the first P-type drift region. The first electrode overlaps a portion of the first isolation structure. The second portion of the N-type epitaxial layer is disposed between the second N-type well region and the second P-type drift region. The gate overlaps a portion of the second isolation structure. A first connection structure electrically couples the first N-type doping region and the first electrode to form the diode.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
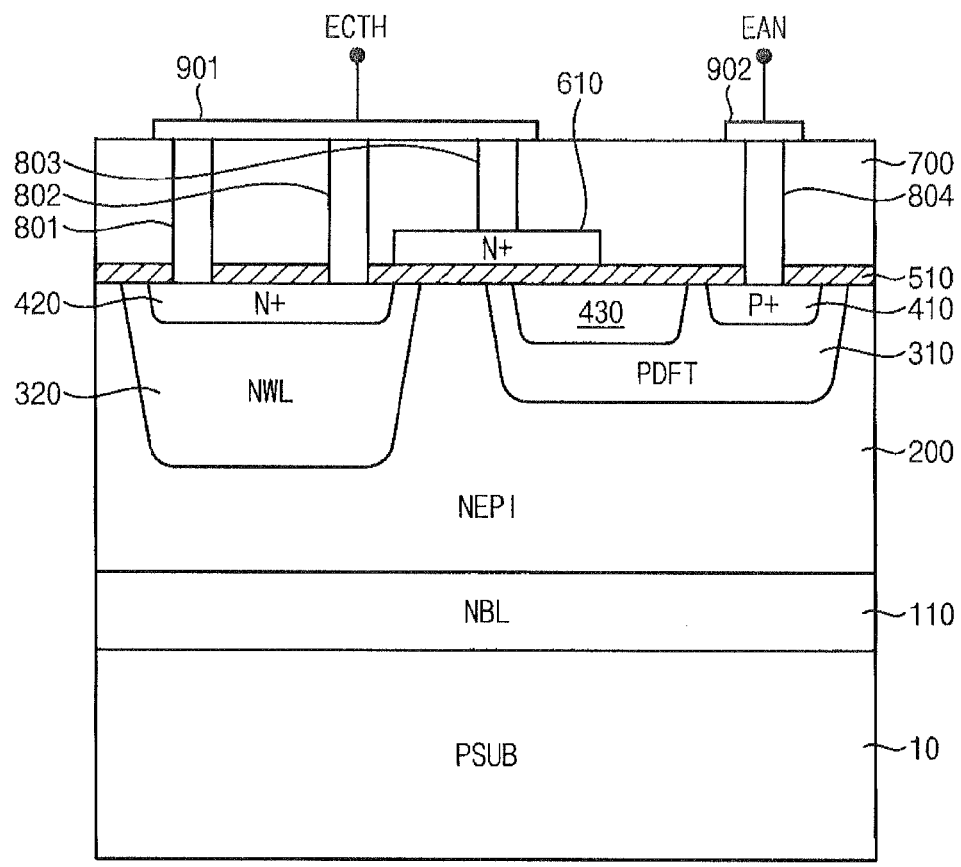
FIG. 1 is a cross-sectional diagram illustrating a diode according to an exemplary embodiment.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when a layer is referred to as being "on" another layer or substrate, it may be directly on the other layer or substrate, or intervening layers may also be present. Like reference numerals may refer to the like elements throughout the specification and drawings.

It will be understood that when an element is referred to as being "connected" or "coupled" to another element, it may be directly connected or coupled to the other element or intervening elements may be present.

Figure 2:
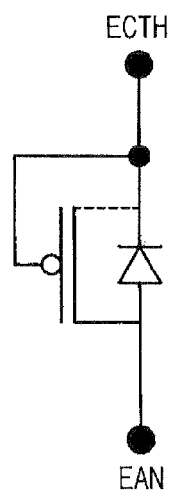
FIG. 2 is a diagram illustrating an equivalent circuit of the diode of FIG. 1.

FIG. 1 is a cross-sectional diagram illustrating a diode having a high breakdown voltage according to an exemplary embodiment, and FIG. 2 is a diagram illustrating an equivalent circuit of the diode of FIG. 1.

Referring to FIGS. 1 and 2, a diode 1000 includes a cathode electrode ECTH and an anode electrode EAN. In this disclosure, the electrodes may refer to doping regions alone or vertical contacts and/or metal patterns in addition to the doping regions. One electrode may include one or more structures forming an equipotential assembly.

The cathode electrode ECTH includes at least a first electrode 610 and an N-type doping region 420 formed in an N-type well region (NWL) 320. The anode electrode EAN includes at least a P-type doping region 410 formed in a P-type drift region (PDFT) 310. As described with reference to FIGS. 3 and 4, the diode 1000 has a modified structure of an LDMOS transistor.

For example, the diode 1000 has a modified structure of a P-type LDMOS transistor and is formed using a process for fabricating the P-type LDMOS transistor. The first electrode 610 of the diode 100 corresponds to a gate of the P-type LDMOS transistor. The P-type LDMOS includes an N-type well corresponding to the N-type well region 320. The P-type LDMOS includes a P-type drift region corresponding to the P-type drift region 310. The P-type LDMOS includes a P-type doping region corresponding to the P-type doping region 410. In an exemplary embodiment, the corresponding parts of the diode 1000 and the P-type LDMOS transistor may be simultaneously formed using the process for fabricating the P-type LDMOS transistor.

The cathode electrode ECTH includes the first electrode 610, the N-type doping region 420, vertical contacts 801, 802 and 803, and a metal pattern 901. The first electrode 610, the N-type doping region 420, vertical contacts 801, 802 and 803, and a metal pattern 901 are electrically coupled to each other. The metal pattern 901 is coupled, through the vertical contacts 801 and 802 penetrating a dielectric layer 510 and an interlayer dielectric layer 700, to the N-type doping region 420. The metal pattern 901 is also coupled, through the vertical contact 803, to the first electrode 610. The number of the vertical contacts coupling the N-type doping region 420 and the metal pattern 901 and the number of the vertical contacts coupling the first electrode 610 and the metal pattern 901 may be varied.

The anode electrode EAN includes a vertical contact 804, a metal pattern 902, and the p-type doping region 410.

The first electrode 610 of the cathode electrode ECTH includes a poly silicon layer that is doped with an N-type dopant. As described with reference to FIG. 10, the first electrode 610 and the N-type doping region 420 of the cathode electrode ECTH may be doped simultaneously with a same kind of an N-type dopant.

In an exemplary embodiment, an isolation structure 430 is formed in the P-type drift region 310 between the first electrode 610 and the P-type doping region 410. The isolation structure includes a shallow trench isolation (STI) structure. The isolation structure 430 isolates the first electrode 610 and the P-type doping region 410 to reduce an electrical interaction between the first electrode 610 receiving a high voltage and the P-type doping region 410.

In an exemplary, embodiment, the diode 1000 is formed on a semiconductor substrate (PSUB) 10. For example, the semiconductor substrate 10 is formed of a P-type semiconductor substrate. An N-type epitaxial layer (NEPI) 200 is grown on the semiconductor substrate 10 and the N-type well region 320 and the P-type drift region 310 is formed in an upper portion of the N-type epitaxial layer 200. For example, an N-type buried layer NBL 110 is formed on the semiconductor substrate 10 and the N-type epitaxial layer 200 is formed on the N-type buried layer NBL 110.

Figure 3:
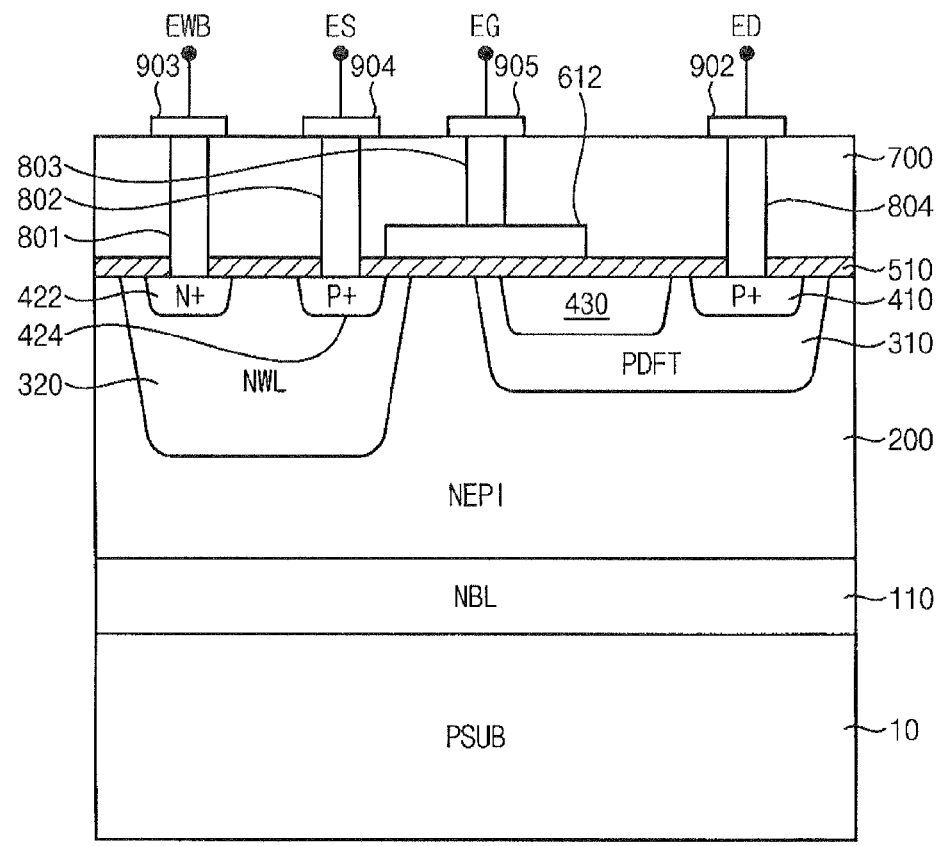
FIG. 3 is a cross-sectional diagram illustrating a P-type LDMOS transistor.
Figure 4:
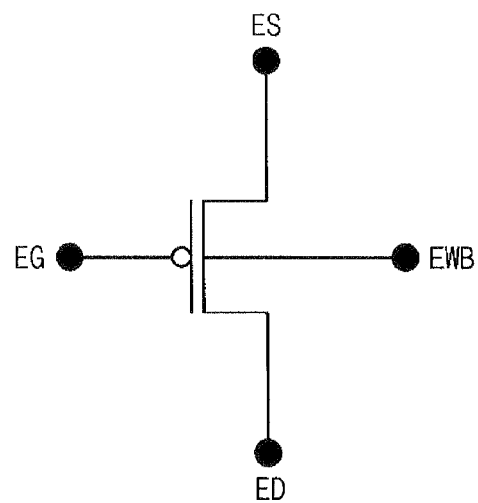
FIG. 4 is a diagram illustrating an equivalent circuit of the P-type LDMOS transistor of FIG. 3.

FIG. 3 is a cross-sectional diagram illustrating a P-type LDMOS transistor, and FIG. 4 is a diagram illustrating an equivalent circuit of the P-type LDMOS transistor of FIG. 3. The diode 1000 of FIG. 1 and the P-type LDMOS transistor 1100 have common structures, and the repeated descriptions may be omitted.

Referring to FIGS. 3 and 4, the P-type LDMOS transistor 1100 includes a well bias electrode EWB, a source electrode ES, a gate electrode EG and a drain electrode ED. The well bias electrode EWB includes at least a well bias region 422 formed in an N-type well region (NWL) 320, and the source electrode ES includes at least a source region 424 formed in the N-type well region 320. The gate electrode EG includes at least a gate 612 and the drain electrode ED includes at least a drain region 410 formed in a P-type drift region (PDFT) 310.

Comparing the diode 1000 of FIG. 1 and the P-type LDMOS transistor 1100 of FIG. 3, the P-type doping region 410 of the diode 1000 corresponds to the drain region 410 of the P-type LDMOS transistor 1100. The N-type doping region 420 of the diode 1000 is formed in the NWL 320 of the diode 1000 in place of the well bias region 422 and the source region 424 of the P-type LDMOS transistor 1100.

In the P-type LDMOS transistor 1100, the well bias region 422, the source region 424 and the gate 612 are coupled, through the vertical contacts 801, 802 and 803, to the metal patterns 903, 904 and 905, respectively.

As such, the diode 1000 is fabricated using a design rule of the P-type LDMOS process. Further, the diode 1000 has a high breakdown voltage of the P-type LDMOS transistor.

FIGS. 5 through 13 are cross-sectional structures for describing a method of manufacturing a diode using a method of manufacturing a P-type LDMOS transistor according to an exemplary embodiment.

Figure 5:
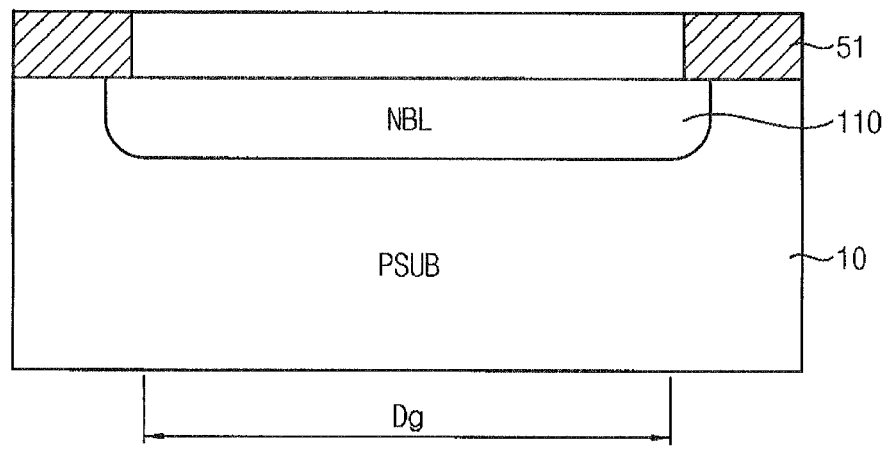
FIGS. 5 through 13 are cross-sectional diagrams for describing a method of manufacturing a diode according to an exemplary embodiment.

Referring to FIG. 5, an N-type buried later (NBL) 110 is formed on an upper portion of a semiconductor substrate 10 using a mask pattern 51. The mask pattern 51 defines a diode region Dg in which the N-type buried layer is to be formed. The diode 1000 of FIG. 1 is formed on the NBL 110. For example, the mask pattern 51 may be formed by forming an oxide layer and/or a nitride layer on the upper surface of the semiconductor substrate 10 and then by performing an etching process with respect to the formed layer. Using the mask pattern 51, the N-type buried layer 110 is formed by performing an ion-implanting process with an N-type dopant. After the N-type buried layer 110 is formed, the mask pattern 51 may be removed through a wet etching process, for example.

The semiconductor substrate 10 may include, but is not limited to, a silicon (Si) semiconductor substrate, a gallium-arsenic (Ga—As), a silicon-germanium (Si—Ge) semiconductor substrate, a ceramic semiconductor substrate, a quartz semiconductor substrate, or a glass semiconductor substrate.

Figure 6:
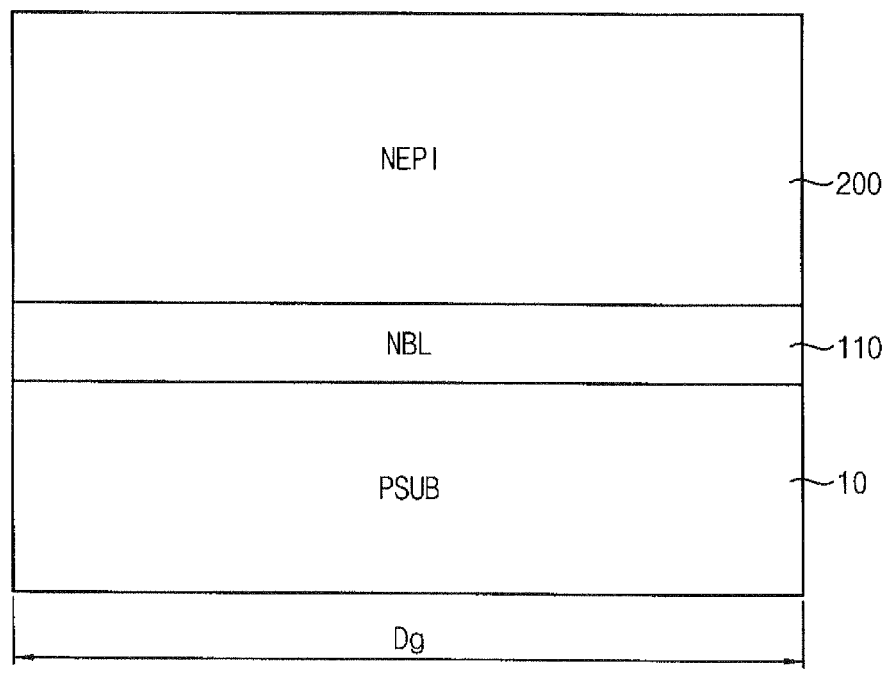

Referring to FIG. 6, an N-type epitaxial layer 200 is formed on the n-type buried layer 110 using an epitaxial growth method including, but not limited to, a selective epitaxial growth process, or a solid phase epitaxial growth (SPE) process.

Figure 7:
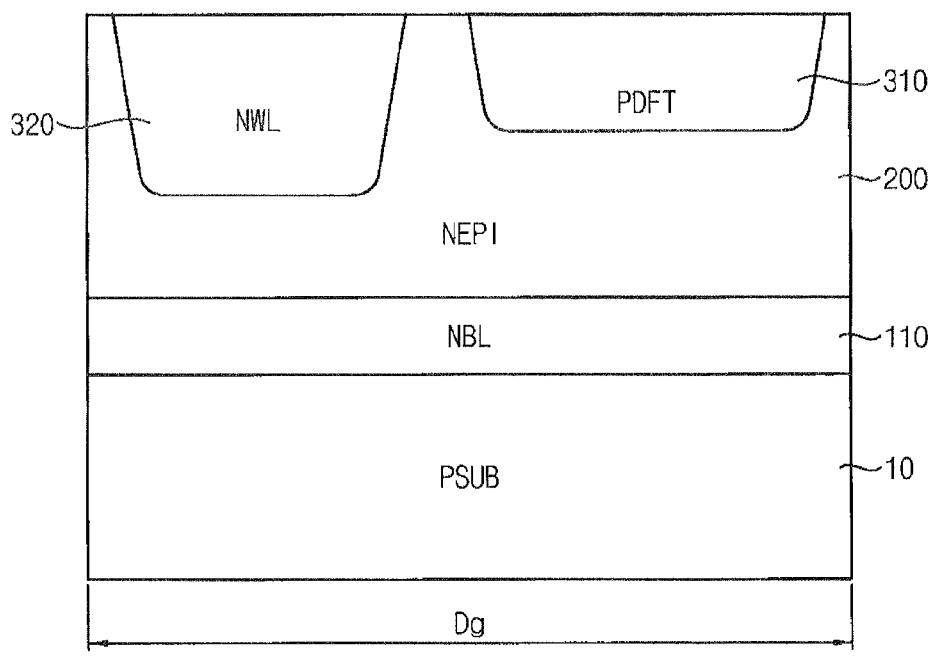

Referring to FIG. 7, an N-type well region 320 is formed in a first upper portion of the N-type epitaxial later 200 and a P-type drift region 310 is formed in a second upper portion of the N-type epitaxial later 200 such that the N-type well region 320 is spaced apart from the P-type drift region 310. Each of the N-type well region 320 and the P-type drift region 310 is formed through the mask patterning process, the ion-implanting process and the mask removing process as described with reference to FIG. 5.

Figure 8:
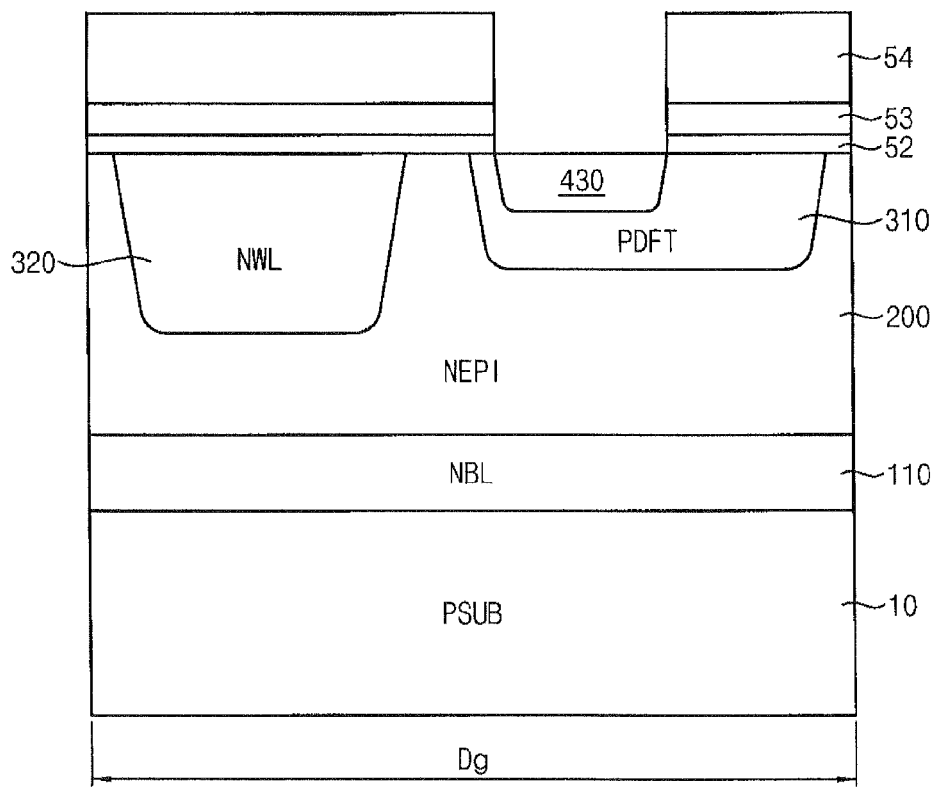

Referring to FIG. 8, an isolation structure 430 is formed in the P-type drift region 310 to isolate a first electrode 610 to be formed and a P-type doping region 410 to be formed. For example, the isolation structure 430 is formed using a shallow trench isolation (STI) process. After forming a pad oxide layer 52, a pad nitride layer 53 and a photoresist layer 54, an etching process is performed to form the isolation structure 430.

Figure 9:
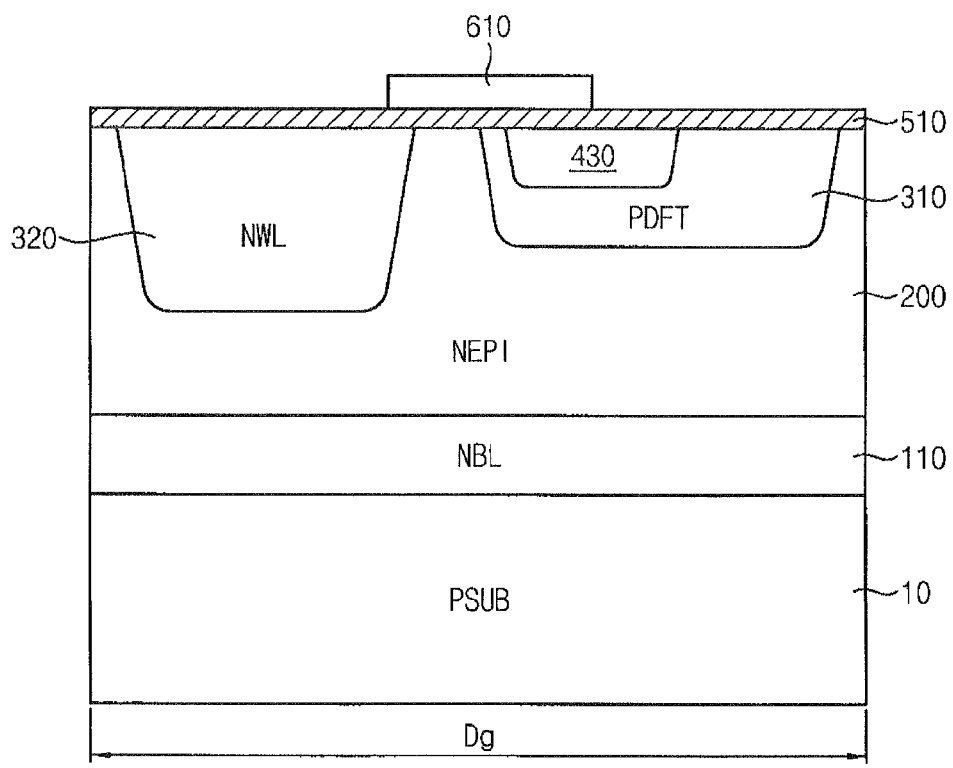

Referring to FIG. 9, the first electrode 610 is formed on part of the N-type epitaxial layer 200 disposed between the N-type well region 320 and the P-type drift region 310. For example, a gate dielectric layer 510 such as an oxide layer is formed on the entire upper surface of the N-type epitaxial layer 200, and a conduction layer (now shown) such as a poly-silicon layer is deposited on the gate dielectric layer 510. The first electrode 610 is formed by patterning the poly-silicon layer. The first electrode 610 is formed of various conductive materials such as metal, poly-silicon, or a combination thereof. The first electrode 610 overlaps a portion of the P-type drift region 310. The first electrode 610 also overlaps a portion of the isolation structure 430. An insulation structure (not shown) may be further formed at both side walls of the first electrode 610. In an exemplary embodiment, the first electrode 610 may be simultaneously formed with a gate of a P-type LDMOS transistor and the length L of the first electrode 610 may be substantially the same with the length of the P-type LDMOS transistor.

Figure 10:
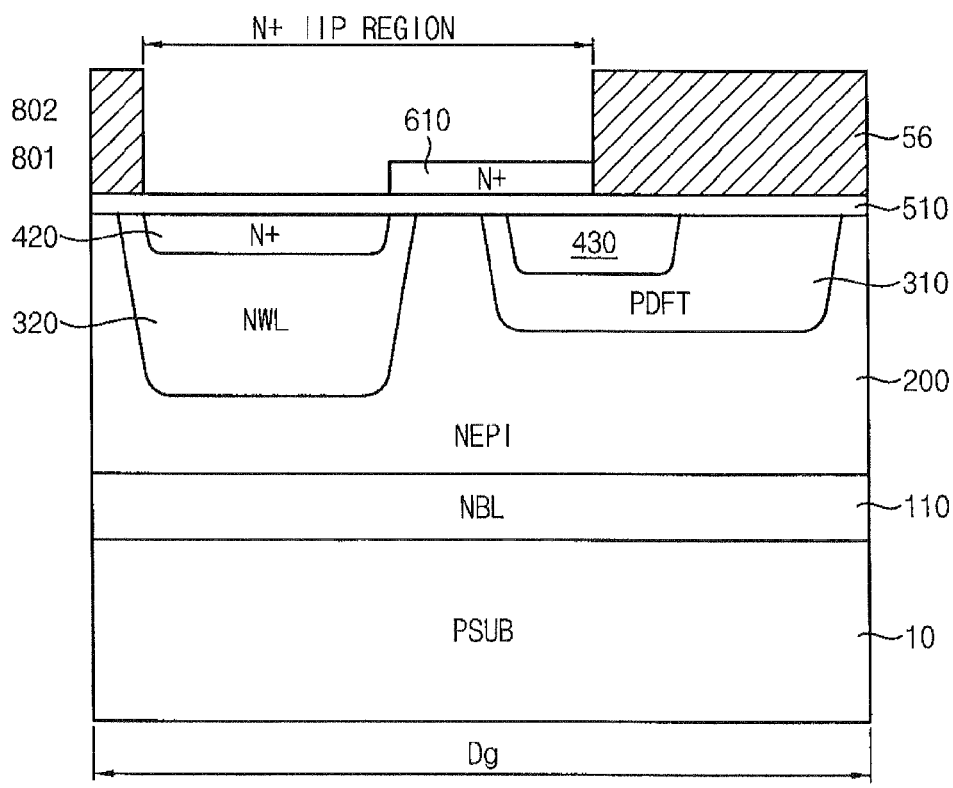

Referring to FIG. 10, an N-type doping region 420 is formed in the N-type well region 320. An N-type ion-implanting (IIP) region 800 is defined by a mask pattern 56 exposing the first electrode 610 and a portion of the N-type well region 320 in which the N-type doping region 420 is to be formed. The defined N-type IIP region is doped with an N-type dopant of higher density than the N-type well region 320. As such, forming the N-type doping region 420 and doping the first electrode 610 is performed simultaneously using the mask pattern 56. The mask pattern 56 is removed after forming the N-type doping region 420.

Figure 11:
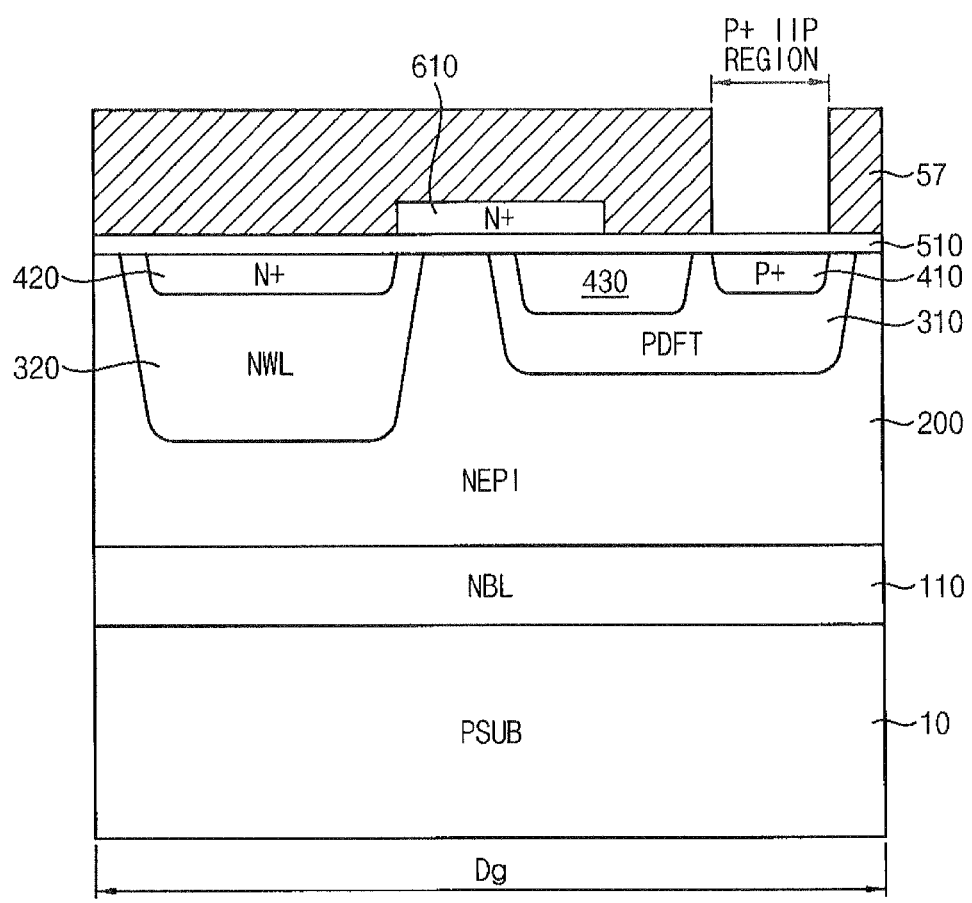

Referring to FIG. 11, a P-type doping region 410 is formed in the P-type drift region 310. A P-type IIP region 460 is defined by a mask pattern 57 exposing a portion in which the P-type doping region 410 is to be formed, and the defined P-type IIP region 460 is doped with a P-type dopant of higher density than the P-type drift region 310. The mask pattern 57 is removed after forming the P-type doping region 410.

Figure 12:
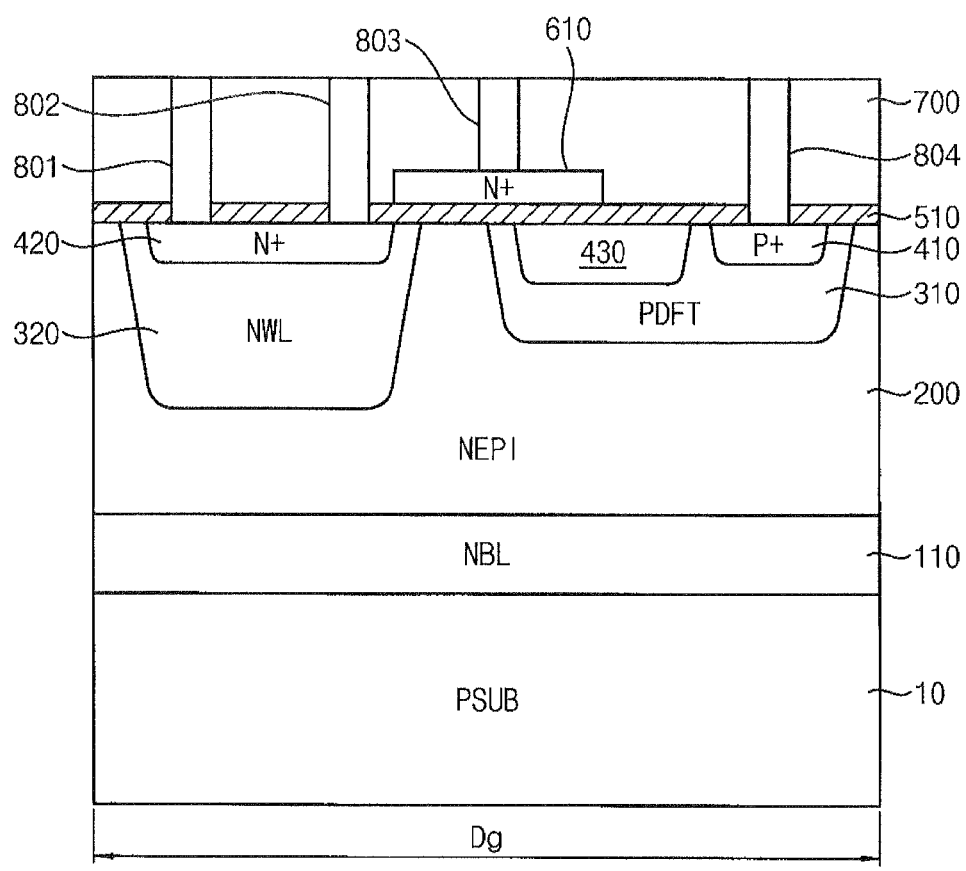
Figure 13:
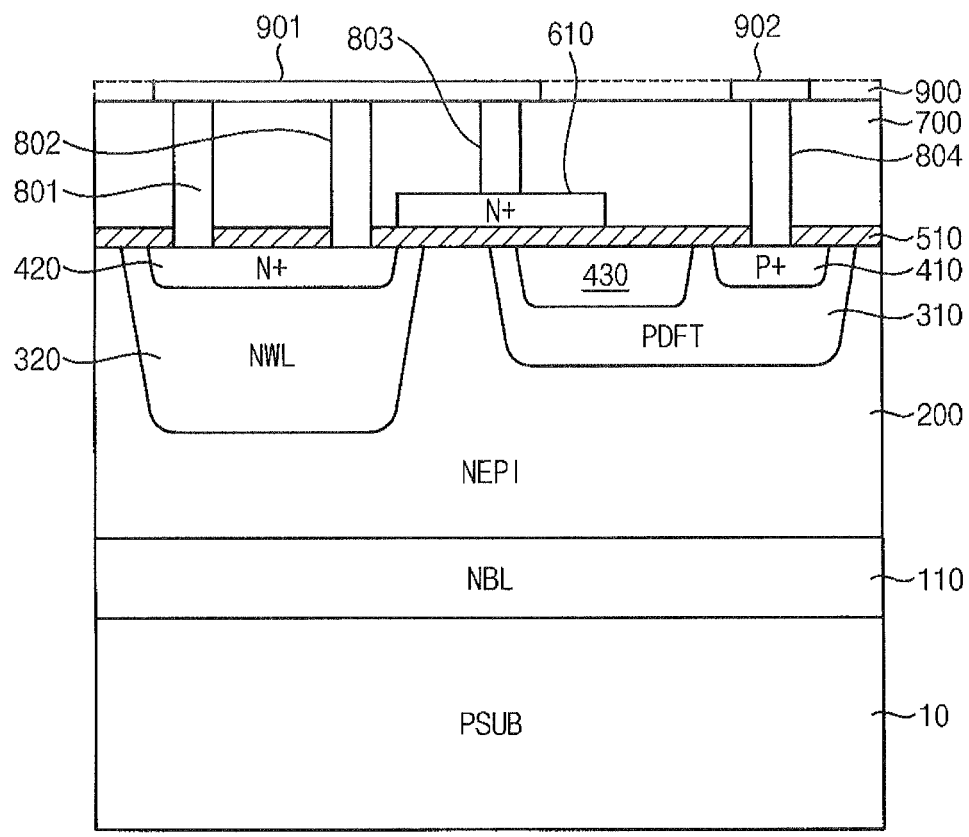

Referring to FIGS. 12 and 13, after forming an interlayer dielectric layer 700, corresponding portion of the interlayer dielectric layer 700 are etched to expose the N-type doping region 420, the first electrode 610 and the P-type doping region 410. A heating process of high temperature is performed and then metal is deposited in the etched portions to form the vertical contacts 801, 802, 803 and 804. After performing a planarization process with respect to the upper surface of the interlayer dielectric layer 700, a metal layer (now shown) is deposited on the flattened surface, and then the metal layer is patterned to form the metal patterns 901 and 902 as illustrated in FIG. 13. As described above, the N-type doping region 420 and the first electrode 610 are electrically coupled through the vertical contacts 801, 802 and 803 and the metal pattern 901.

Manufacturing of the diode 1000 of FIG. 1 is not be limited to processes as described with reference to FIGS. 5 through 13. The process sequence of the processes of FIGS. 5 through 13 may be changed, or some processes may be modified and/or added according to the structure of a diode according to an exemplary embodiment.

Figure 14:
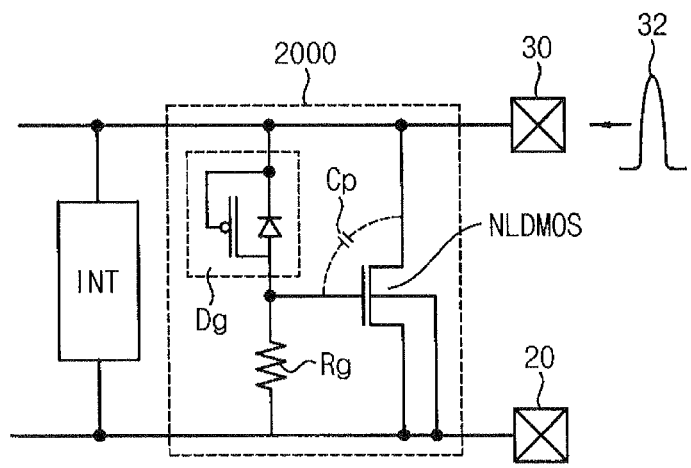
FIG. 14 is a circuit diagram illustrating an electrostatic discharge (ESD) protection circuit according to exemplary embodiments.
Figure 15:
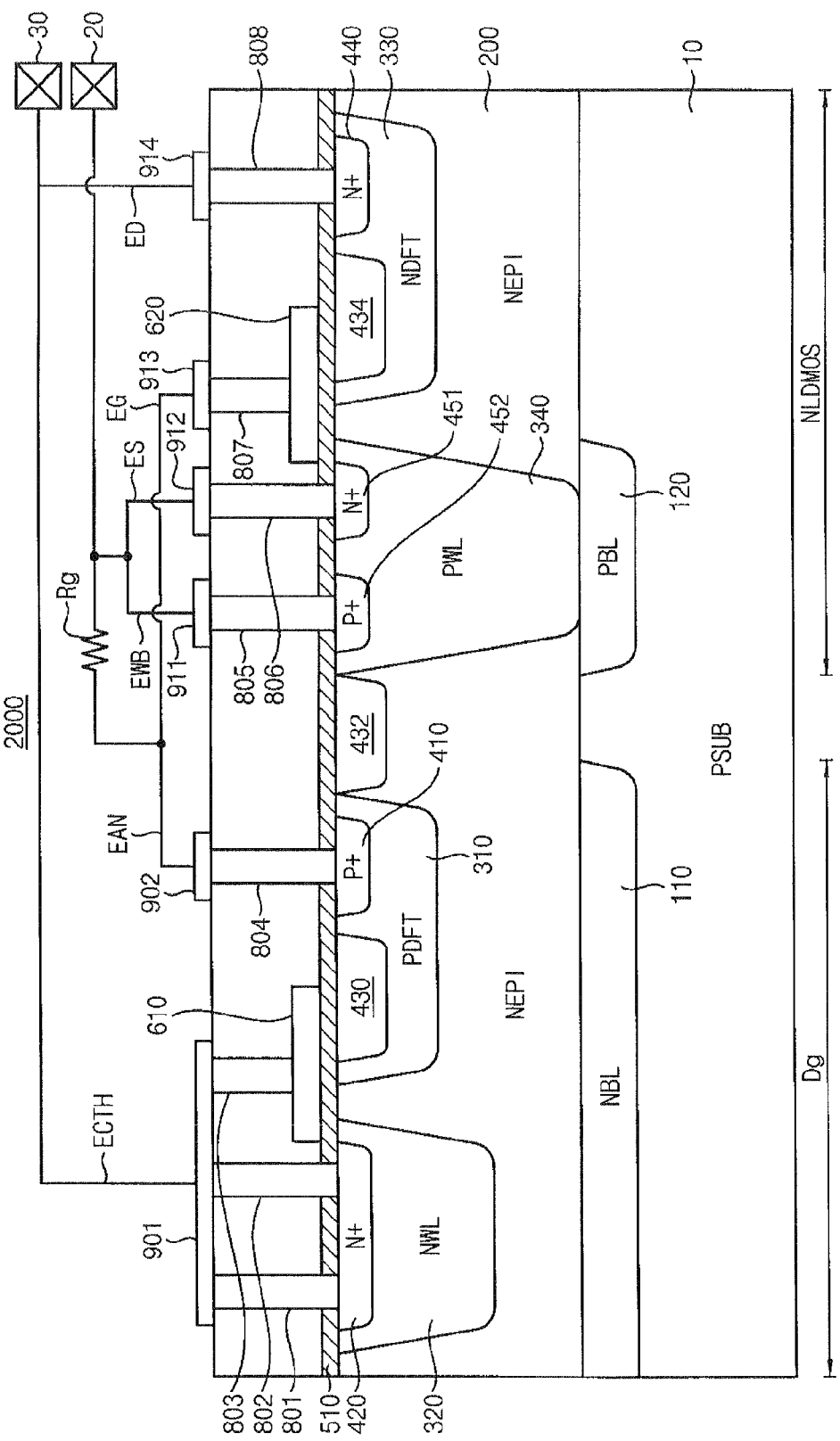
FIG. 15 is a cross-sectional diagram illustrating an ESD protection circuit according to an exemplary embodiment.

FIG. 14 is a circuit diagram illustrating an electrostatic discharge (ESD) protection circuit according to an exemplary embodiment, and FIG. 15 is a cross-sectional diagram illustrating an ESD protection circuit according to an exemplary embodiment.

Referring to FIGS. 14 and 15, an ESD protection circuit 2000 includes an N-type LDMOS transistor NLMMOS, a diode Dg and a resistor Rg. The ESD protection circuit 2000 is coupled between a first pad 20 and a second pad 30. The ESD protection circuit 200 includes the diode Dg having a modified structure of an LDMOST transistor and is configured to couple the second pad 30 to a gate of the N-type LDMOS transistor NLDMOS. The ESD protection circuit 2000 is not limited to the configuration of FIGS. 14 and 15. For example, the diode 1000 as illustrated in FIG. 1 may be used for gate coupling of a P-type LDMOS transistor, and may be used in various ESD circuits such as a silicon controlled rectifier (SRC).

As described with reference to FIGS. 1 through 13, the diode Dg is implemented by modifying the LDMOS transistor. For example, the diode Dg includes a cathode electrode ECTH and an anode electrode EAN. The cathode electrode ECTH includes at least a first electrode 610 and a first N-type doping region 420 formed in a first N-type well region (NWL) 320. The anode electrode EAN includes at least a first P-type doping region 410 formed in a P-type drift region (PDFT) 310. The cathode electrode ECTH is coupled to the second pad 30, and the anode electrode EAN is coupled to a gate 620 of the N-type LDMOS transistor NLDMOS.

The N-type LDMOS transistor NLDMOS is coupled between the first pad 20 to which a first voltage is applied and the second pad 30 to which a second voltage higher than the first voltage is applied. The resistor Rg is coupled between the first pad 20 and the gate 620 of the N-type LDMOS transistor NLDMOS. The resistor Rg is also coupled between the first pad 20 and the anode electrode EAN of the diode Dg.

As described above, in high voltage processes using the LDMOS transistor, it is not each to implement gate coupling using a resistor and a capacitor. According to some conventional techniques, the MOS capacitor for the gate coupling is replaced with a parasitic capacitance Cp between the drain and the gate of the N-type LDMOS transistor. In this case, however, the sufficient voltage cannot be applied to the gate of the N-type LDMOS transistor in the initial stage of the ESD event. The voltage due to the parasitic capacitance Cp may lower the triggering voltage slightly but the channel-on operation cannot be triggered.

The ESD protection circuit 2000 rapidly discharges the charge to protect an internal circuit INT when the high-voltage ESD pulse 32 is applied via the second pad 30 to the internal circuit INT. The ESD protection circuit 2000 rapidly discharges a large amount of charges in the initial stage of the ESD event before the high-voltage ESD pulse 32 damages the internal circuit INT. The fast discharge of the ESD protection circuit 2000 is achieved by the inherent capacitance of the diode Dg.

The diode Dg as described with reference to FIGS. 1 through 13 is included in FIG. 15, and thus the repeated description will be omitted. In addition, the N-type LDMOS transistor NLDMOS in FIG. 15 is formed by processes the same as or similar to the manufacturing processes of the diode Dg as described with reference to FIG. 5 an 13, and thus the configuration of the N-type LDMOS transistor will be mainly described.

Referring to FIG. 15, the N-type LDMOS transistor NLDMOS includes a gate electrode EG including the gate 620, a source electrode ES including a second N-type doping region 451 formed in a first P-type well region (PWL) 340, a well bias electrode EWB including a second P-type doping region 452 formed in the first P-type well region 340, and a drain electrode ED including a third N-type doping region 440 formed in an N-type drift region (NDFT) 330. As described with respect to the diode Dg, the vertical contacts 805, 806, 807 and 808 and the metal patterns 911, 912, 913 and 914 are included respectively in the electrodes EWB, ES, EG and ED. Materials such as polysilicon may be used to form the resistor Rg or a passive resistor element may be used as the resistor Rg.

An isolation structure 434 such as a shallow trench is formed in the N-type drift region to isolate the gate 620 and the third N-type doping region 440. An isolation structure 432 is formed in a boundary region between the diode Dg and the N-type LDMOS transistor NLDMOS.

The first N-type doping region 320 and the P-type drift region 310 of the Diode Dg, and the first P-type doping region 340 and the N-type drift region 330 is formed in an N-type epitaxial layer 200 that is grown on a semiconductor substrate 10.

An N-type buried layer 110 is formed in a first upper portion of the semiconductor substrate 10 and a P-type buried layer 120 is formed in a second upper portion of the semiconductor substrate 10. The diode Dg is formed over the N-type buried layer 110 and the N-type LDMOS transistor NLDMOS is formed on the P-type buried layer 120. The first P-type well region 340 is formed deep to contact the P-type buried layer 120.

Figure 16:
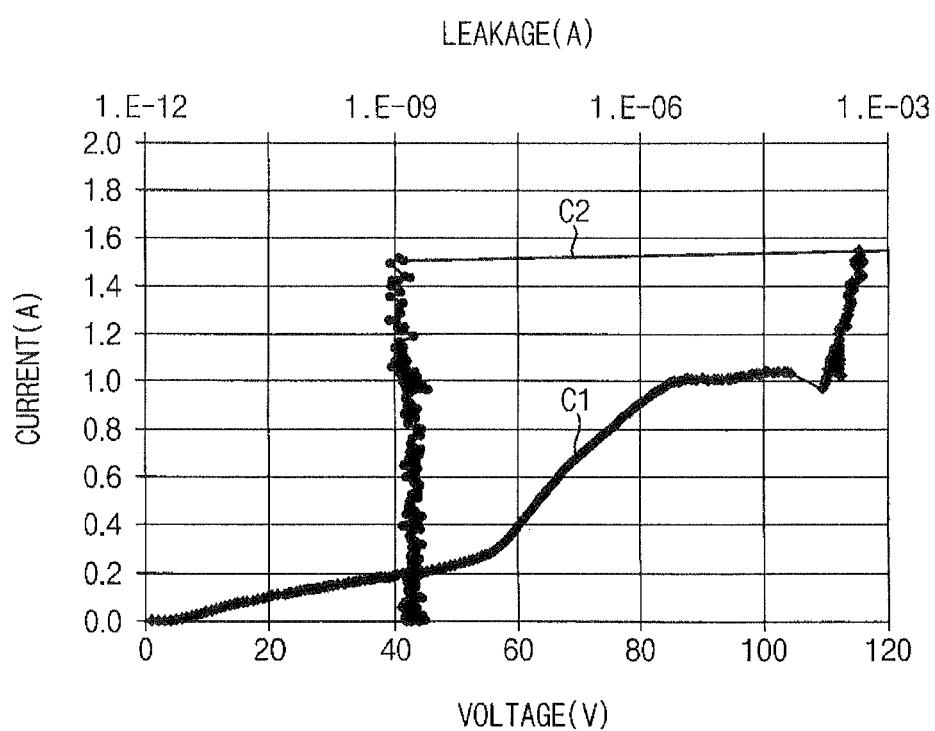
FIG. 16 is a diagram illustrating performance of an ESD protection circuit according to an exemplary embodiment.

FIG. 16 is an V-I curve of illustrating performance of an ESD protection circuit according to an exemplary embodiment.

FIG. 16 illustrates the silicon data of the 70V-process applied to the ESD protection circuit 2000 including the diode Dg according to an exemplary embodiment. The transmission line pulsing (TLP) has been measured by sequentially increasing the voltage level of the pulse having the pulse width of about 100 nanoseconds. The V-I curve C1 and the leakage current line C2 dotted with respect to the increasing voltage levels of the pulse are illustrated in FIG. 16.

As seen in the TLP plot, the ESD protection circuit 2000 may discharge the ESD charge from the initial stage of the ESD event. This effect is caused through the early channel-on operation of the N-type LDMOS transistor NLDMOS due to the gate coupling using the diode Dg. The ESD protection circuit 2000 may discharge the larger amount of the ESD charges than the conventional gate coupling using the parasitic capacitance Cp between the drain and the gate of the N-type LDMOS transistor.

In addition, in the interval over the breakdown voltage of about 80V, the division voltage is applied to the gate of the N-type LDMOS transistor NLDMOS. When the breakdown is caused in the diode Dg, the diode Dg is turned on reversely and the voltage divided by the resistor Rg and the diode Rg is applied to the gate. The division voltage may accelerate the gate coupling and the N-type LDMOS transistor NLDMOS may maintain the small turn-on resistance.

In other words, the diode Dg may apply the induction voltage to the gate 620 of the N-type LDMOS transistor NLDMOS when the voltage lower than the breakdown voltage BV is applied to the ESD protection circuit 2000. The induction voltage is determined by a junction capacitance, that is, a capacitance between the cathode electrode ECTH and the anode electrode EAN of the diode Dg. Also the above-mentioned parasitic capacitance Cp is added to the junction capacitance. In addition, the diode Dg may apply the division voltage to the gate 620 when a voltage higher than the breakdown voltage BV is applied to the ESD protection circuit 2000, thereby accelerating the gate coupling.

Figure 17:
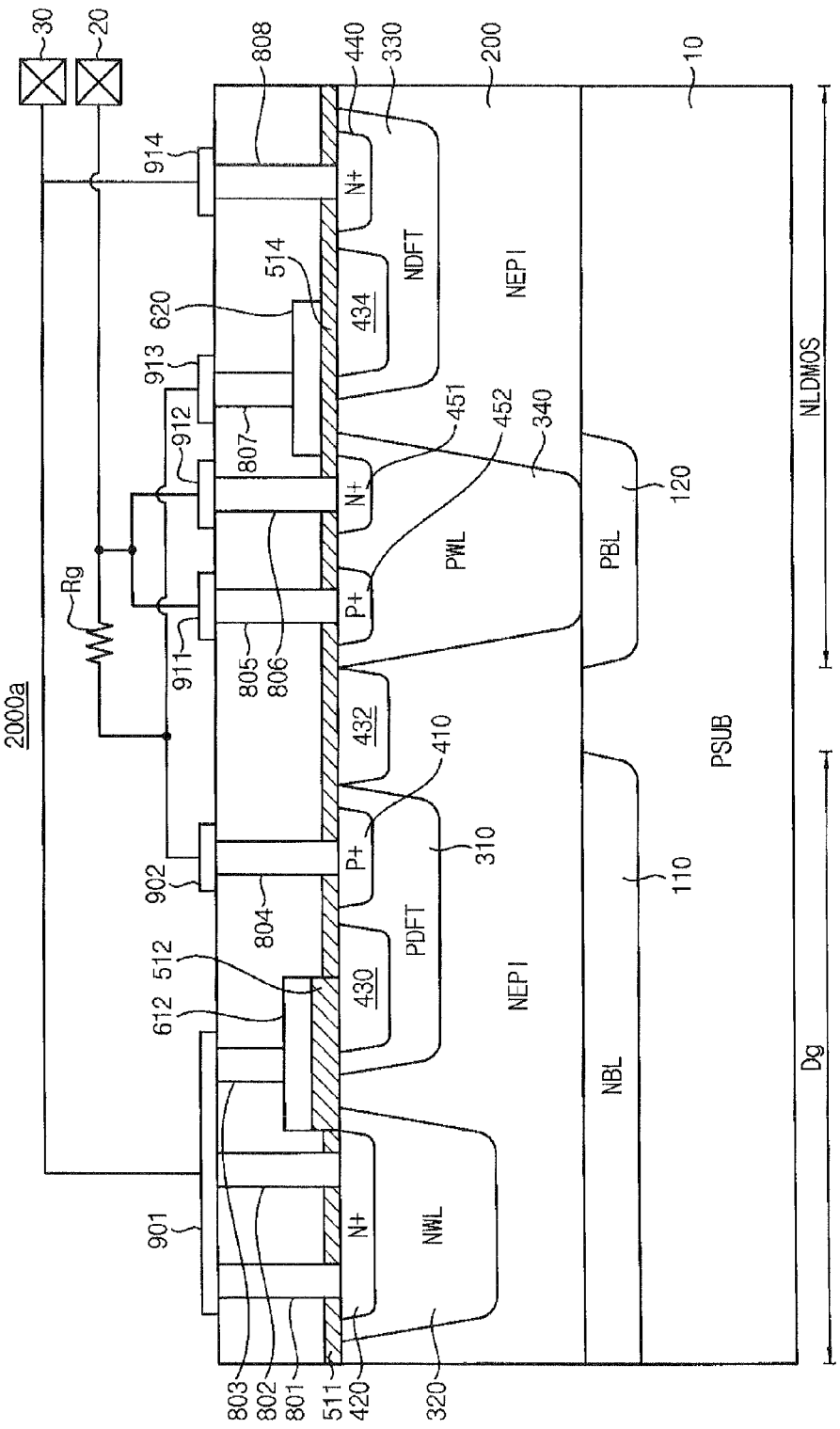
FIG. 17 is a cross-sectional diagram illustrating an ESD protection circuit according to an exemplary embodiment.
Figure 18:
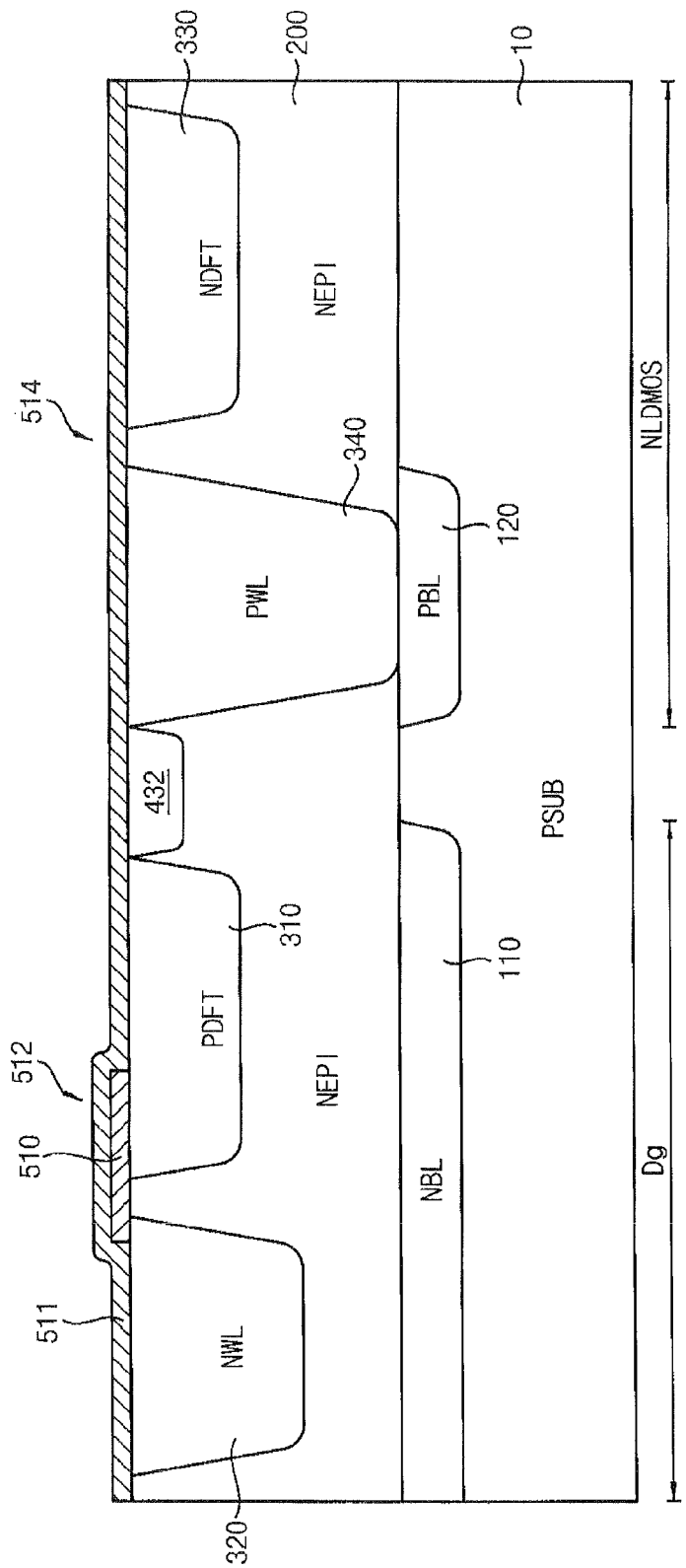
FIG. 18 is a cross-sectional diagram for describing a method of manufacturing the diode of FIG. 17.

FIG. 17 is a cross-sectional diagram illustrating an ESD protection circuit according to an exemplary embodiment, and FIG. 18 is a cross-sectional diagram for describing a method of manufacturing the diode of FIG. 17. The ESD protection circuit 2000a of FIG. 17 is substantially similar to the ESD protection circuit 2000 of FIG. 15. Repeated descriptions are omitted and only the differences are described.

Referring to FIG. 17, the ESD protection circuit 2000a includes a gate dielectric layer 512 disposed under the first electrode 612 of the diode Dg. The gate dielectric layer 512 is thicker than a gate dielectric layer 514 disposed under the gate 620 of the N-type LDMOS transistor NLDMOS. Since the higher voltage is applied to the first electrode 612 than the gate 620, the increased thickness of the gate dielectric layer 512 disposed under the first electrode 612 enhances the reliability of the ESD protection circuit 2000a.

Referring to FIG. 18, a first dielectric layer is formed on the entire upper surface. The first dielectric layer is removed except the portion 510 corresponding to a region on which first electrode 610 is to be formed. Then a second dielectric layer 511 is formed on the entire upper surface. As a result, the gate dielectric layer 512 under the first electrode 612 is formed thicker than the gate dielectric layer 514 disposed under the gate 620.

Figure 19:
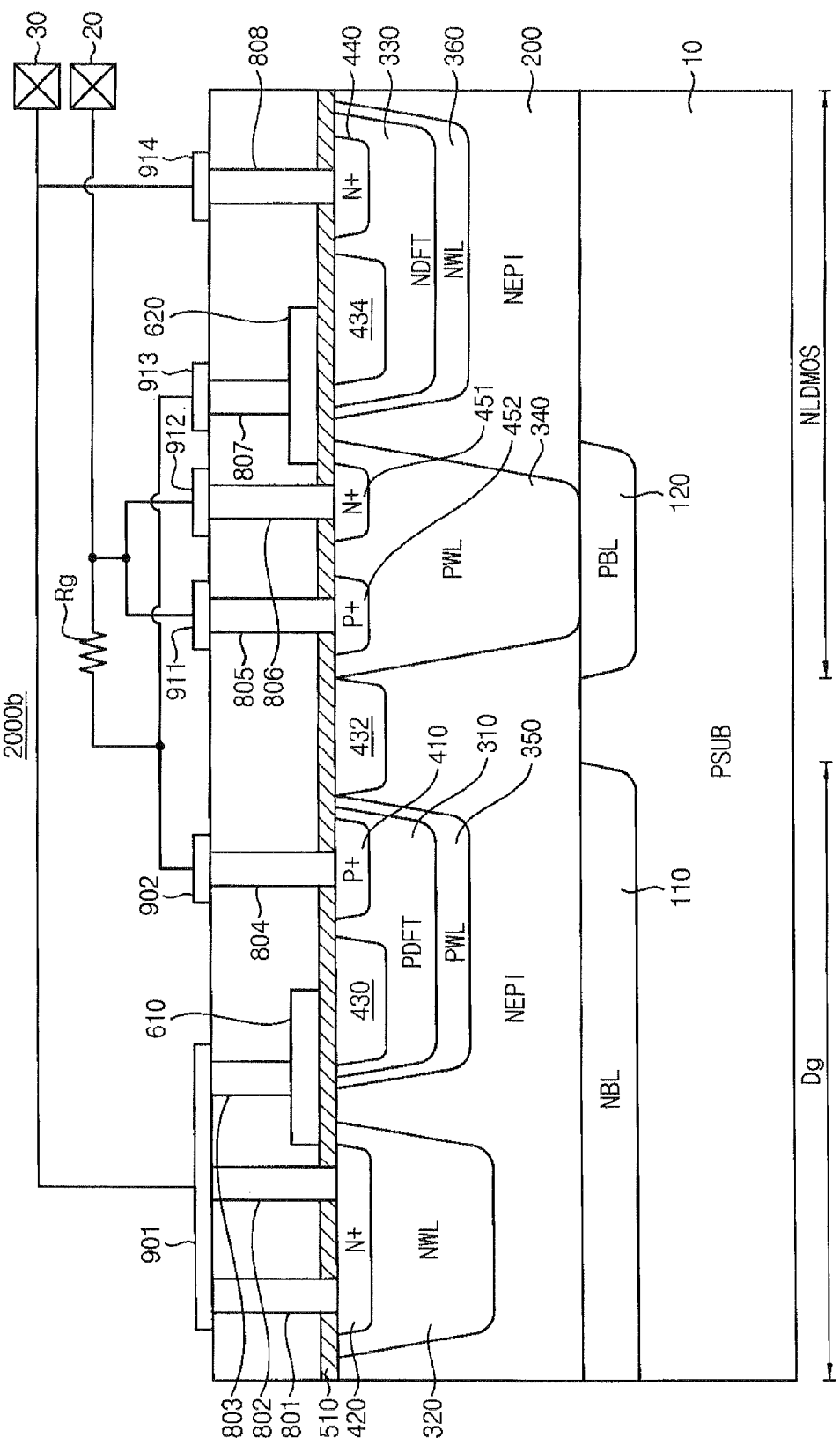
FIGS. 19, 20 and 21 are cross-sectional diagrams illustrating an ESD protection circuit according to exemplary embodiments.
Figure 20:
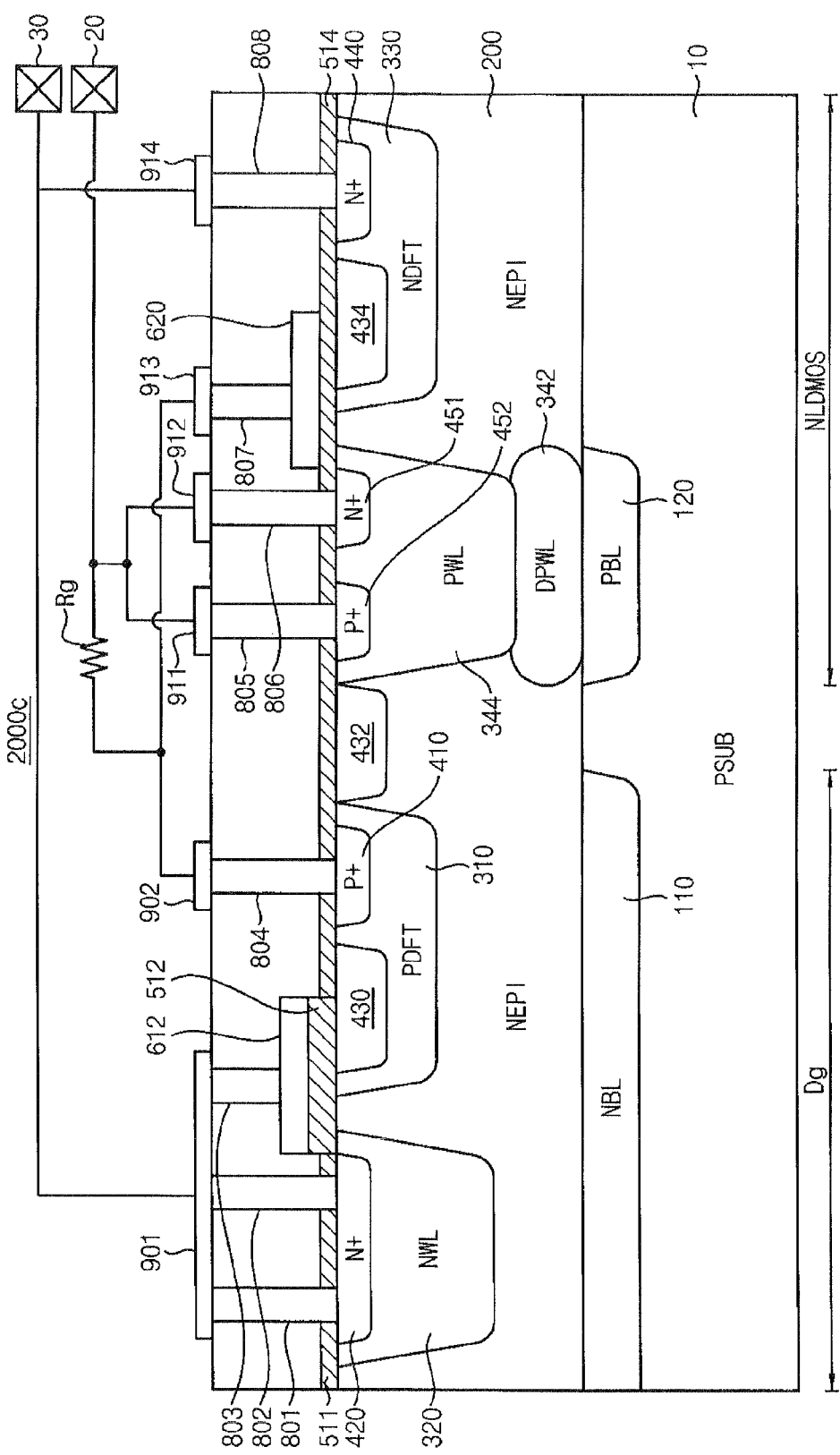
Figure 21:
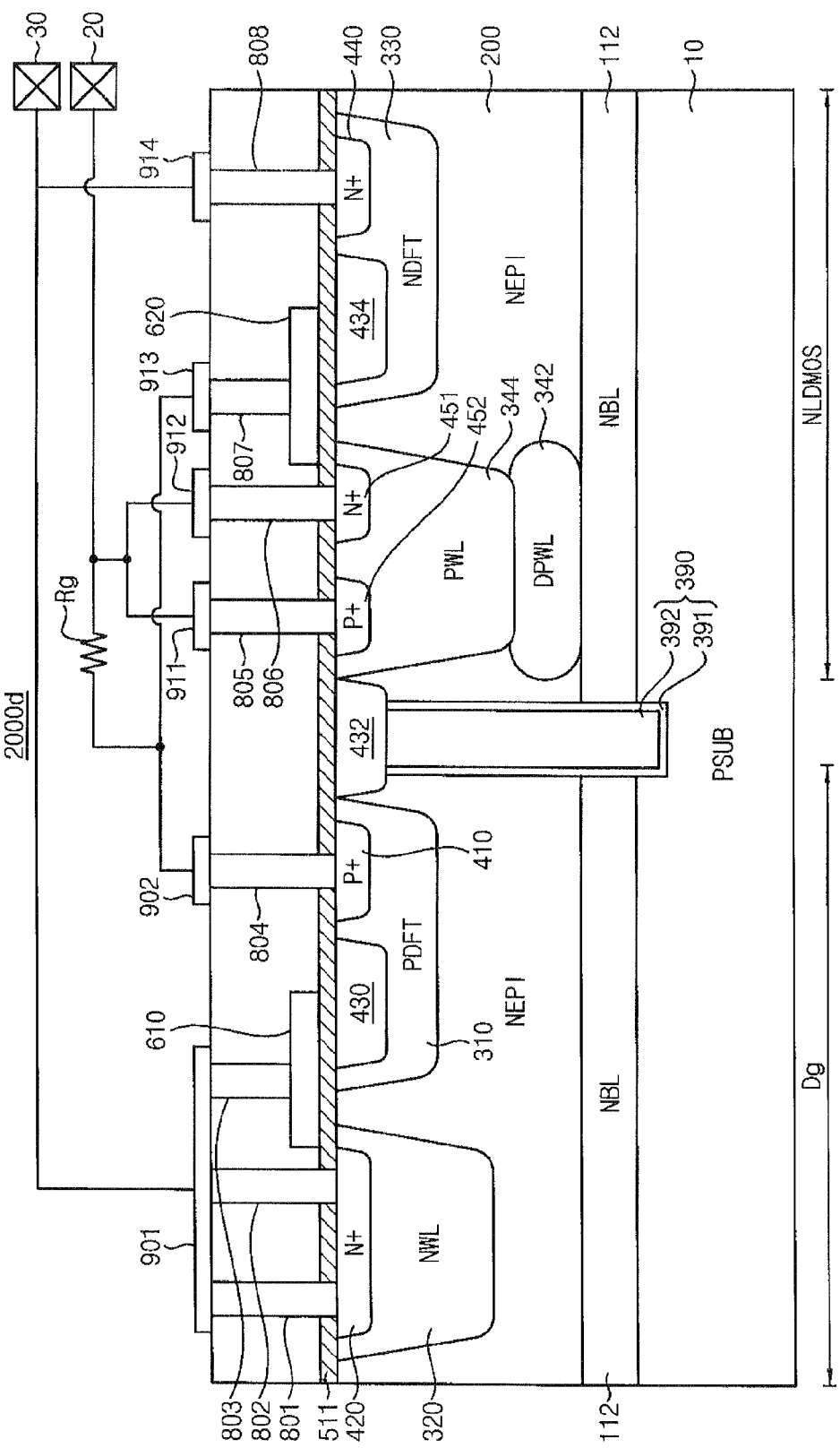

FIGS. 19, 20 and 21 are cross-sectional diagrams illustrating an ESD protection circuit according to exemplary embodiments. The ESD protection circuits 2000b, 2000c and 2000d of FIGS. 19, 20 and 21 are similar to the ESD protection circuit 2000 of FIG. 15. Repeated descriptions will be omitted and only the differences are described.

Referring to FIG. 19, a second P-type well region 350 and a second N-type well region 360 is further formed in the N-type epitaxial layer 200. The P-type drift region 310 is formed in the second P-type well region 350 and the N-type drift region 330 is formed in the second N-type well region 360. The doping density of the second P-type well region 350 is lower than the doping density of the P-type drift region 310, and the doping density of the second N-type well region 360 is lower than the doping density of the N-type drift region 330. The second P-type well region 350 and the second N-type well region 360 serve to increase the break down voltages of the diode Dg and the N-type LDMOS transistor NLDMOS. The embodiment of FIG. 19 may be adopted when it is required to implement the same doping density with respect to a plurality of drift regions respectively included in the LDMOS transistors having the different breakdown voltages.

Referring to FIG. 20, a P-type deep well region 342 is further formed on the P-type buried layer 120. In this case, the first P-type well region 344 is formed to the depth for contacting the P-type deep well region 342. The embodiment of FIG. 20 may be adopted when it is required to implement a plurality of P-type well regions having the same depth, in the bipolar-CMOS-DMOS process for integrating various elements together using the same semiconductor substrates.

Referring to FIG. 21, an N-type buried layer 112 is formed in an upper portion of the semiconductor substrate 10 and the diode Dg and the N-type LDMOS transistor NLDMOS is formed on the N-type buried layer 112. For example, the local N-type buried layer 110 in FIG. 15 and the local P-type buried layer 120 are replaced with the one global N-type buried layer 112.

In this case, a deep trench 390 is formed in a boundary region between the diode Dg and the N-type LDMOS transistor NLDMOS such that the deep trench 390 penetrates the N-type buried layer 112. The deep trench 390 increases the electric shielding effect between the diode Dg and the N-type LDMOS transistor NLDMOS. The deep trench 390 is coated with the oxide film 391 and filled with the conductive material 392.

Figure 22:
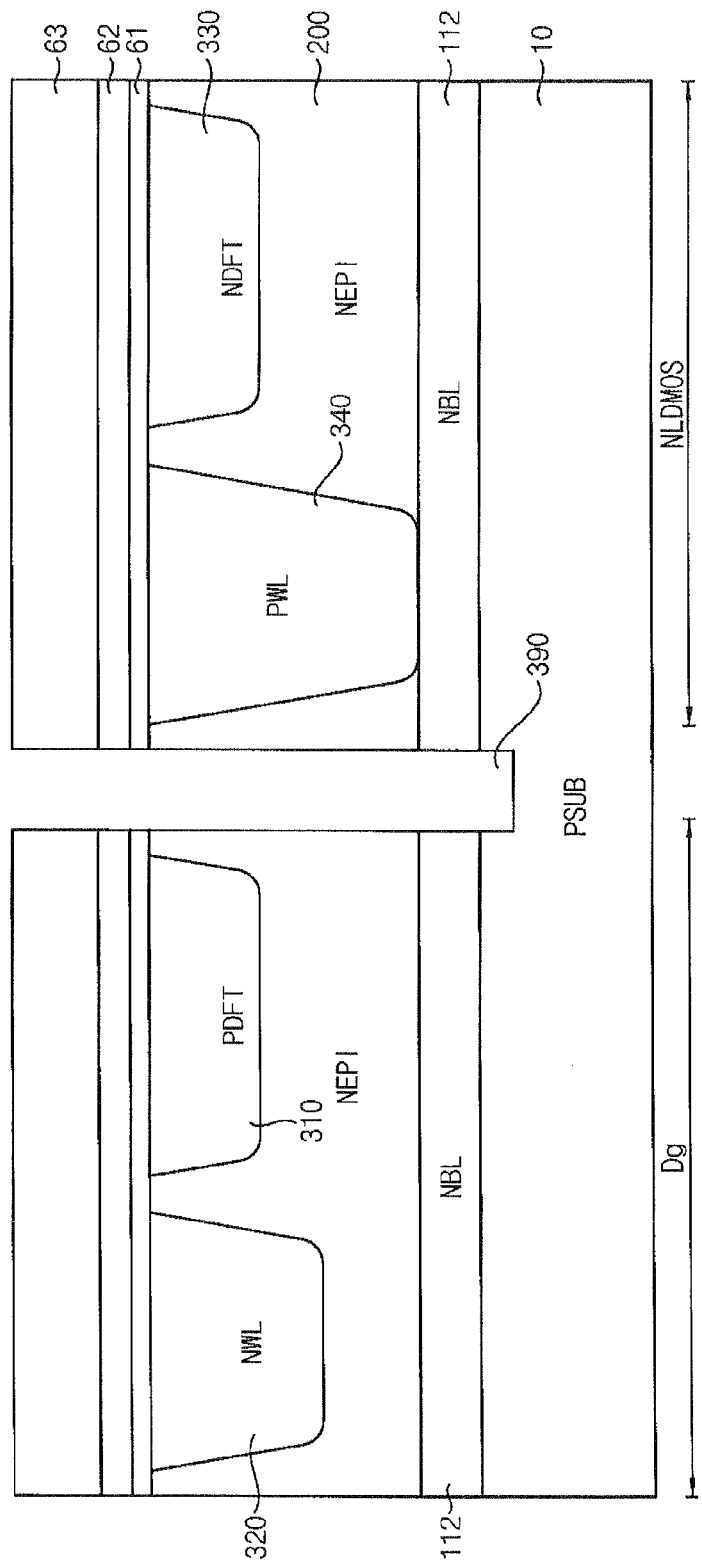
FIGS. 22 and 23 are cross-sectional diagrams for describing a method of manufacturing the diode of FIG. 21.
Figure 23:
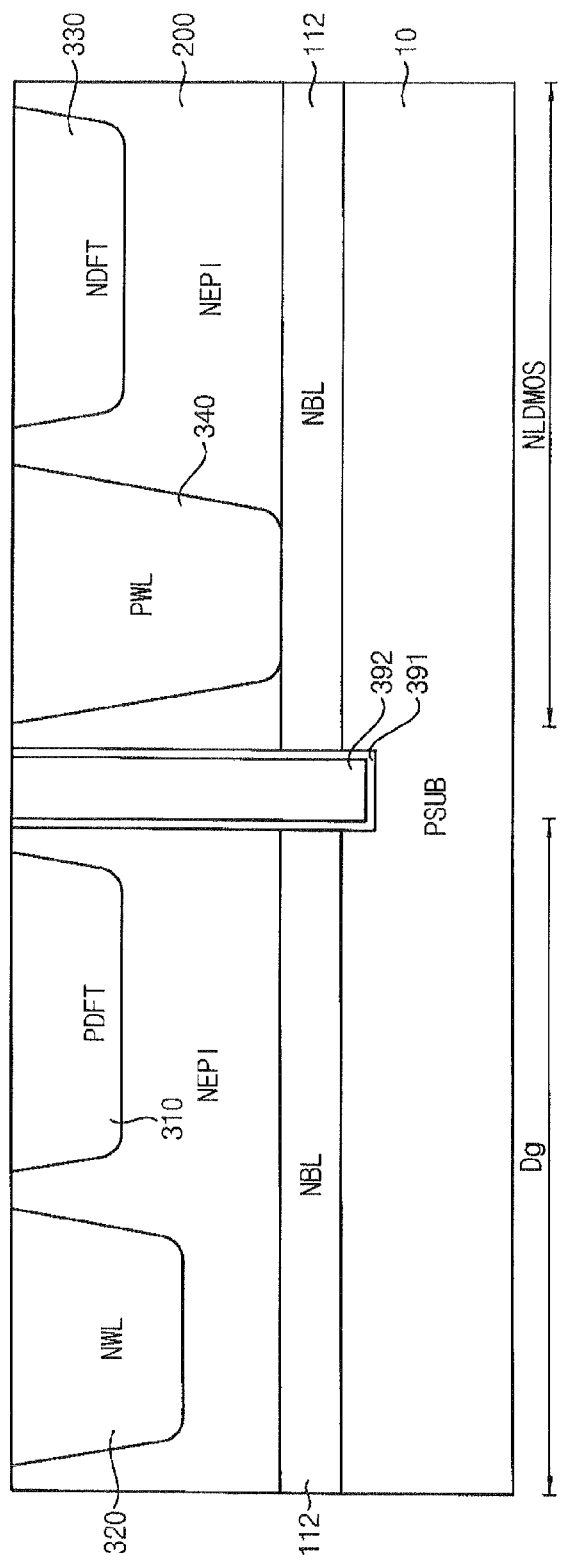

FIGS. 22 and 23 are cross-sectional diagrams for describing a method of manufacturing the diode of FIG. 21.

Referring to FIG. 22, after forming a pad oxide layer 61 and a pad nitride layer 62, the deep trench isolation (DTI) process is performed to form the deep trench 390. For example, using the patterned hard mask 63 as the etching stop, the pad oxide layer 61 and the pad nitride layer 62 are etched such that the deep trench 390 penetrates the N-type buried layer 112.

For example, the deep trench 390 is formed using the Bosch process. For example, the deep trench 390 is formed by repeatedly performing an inductive coupled plasma deep reactive ion etching (ICP DRIE) process using $SF_6$ or $O_2$ plasma and a sidewall passivation process using $CF_x$ radicals that are generated from $C_4F_8$, for example.

Referring to FIG. 23, the deep trench 390 is filled with the oxide 391 and the conductive material 392. For example, Tetraethyl orthosilicate (TEOS) oxide 391 is deposited with respect to the entire upper surface and then the heating process is performed. Then the polysilicon 392 is deposited and the chemical mechanical polishing (CMP) process is performed to remove the oxide and polysilicon on the upper surface and flatten the upper surface. As such, the electrical shielding effect is enhanced by filling the deep trench 390.

Figure 24:
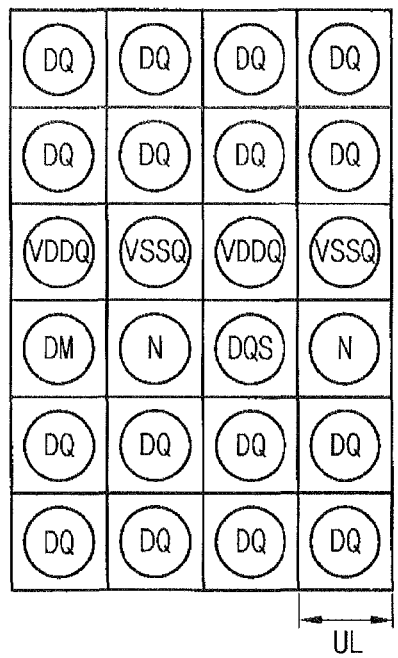
FIG. 24 is a diagram illustrating an exemplary layout of an input-output pad part in a semiconductor memory device.

FIG. 24 is a diagram illustrating pad array of a semiconductor memory device according to an exemplary embodiment.

Referring to FIG. 24, an input-output pad unit includes a plurality of unit pad areas. In FIG. 24, one quadrangle corresponds to a unit pad area of a unit length UL, one pad and one bump are formed in each unit pad area, and the neighboring pads are spaced apart from each other. The bump is disposed on the pad. DQ represents a data bump pad for transferring data, VDDQ and VSSQ represent a power bump pad for transferring a power supply voltage and a ground voltage, DQS represents a strobe bump pad, N represents a dummy pad that a bump is omitted on a pad, and DM represents a data mask bump pad.

As illustrated in FIG. 24, two power bump pads VDDQ and VSSQ are disposed adjacent to each other, another two power bump pads VDDQ and VSSQ are disposed adjacent to each other. Such configuration of the power bump pads VDDQ and VSSQ may be applied to a memory device. Such configuration of the power bump pads VDDQ and VSSQ may be applied to various devices including, but are not limited thereto, a memory controller, a power converter, a display driver integrated circuit, or an RF device.

Figure 25:
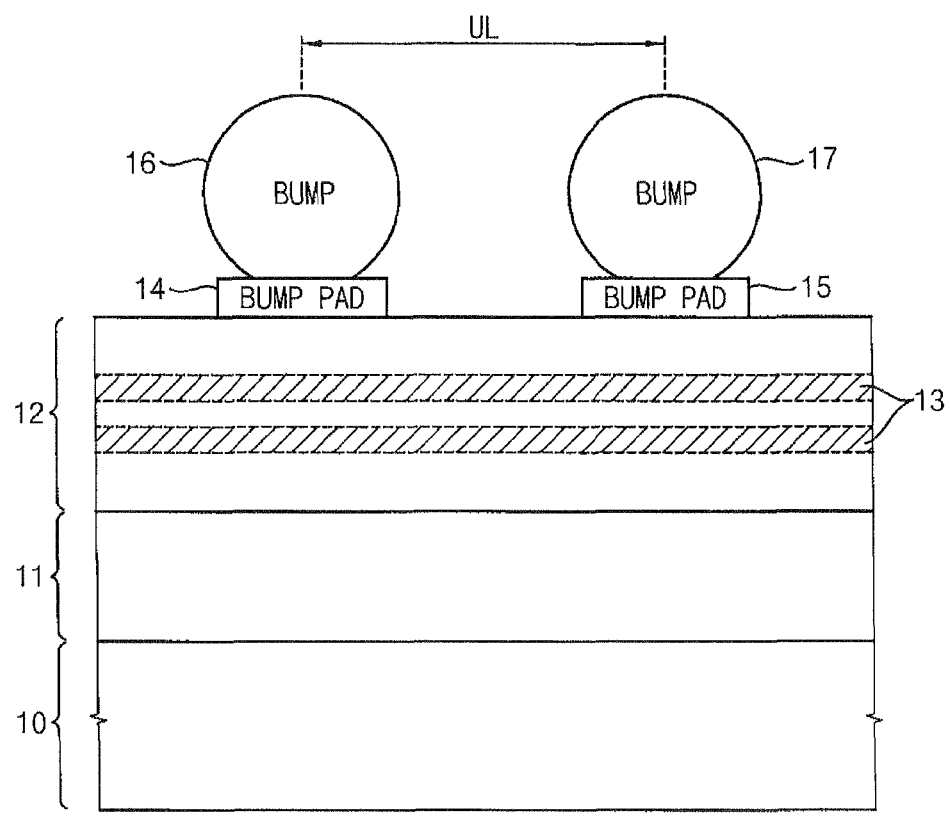
FIG. 25 is a diagram for describing a vertical structure of the input-output pad part of FIG. 24.
Figure 26:
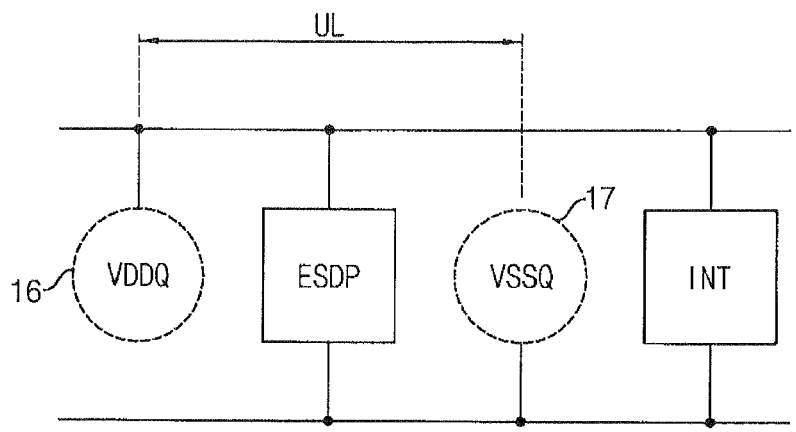
FIG. 26 is a diagram illustrating an exemplary power pad region in the input-output pad part of FIG. 24.

FIG. 25 is a vertical structure illustrating the input-output pad part of FIG. 24, and FIG. 26 is a block diagram illustrating a power pad region of the input-output pad unit of FIG. 24.

Referring to FIG. 25, the vertical structure includes a substrate region 10, an epitaxial region 11, an upper region 12, bump pads 14 and 15 and bumps 16 and 17. A unit length UL represents a unit pad area of two neighboring bumps 16 and 17. The diode Dg and/or the ESD protection circuit as disclosed herein are formed in the substrate region 10, the epitaxial region 11 and the upper region 12. The structural elements shown in FIG. 25 is formed using semiconductor processes such as depositing, etching, doping, patterning, sputtering, heating, etc.

The upper region 12 includes a plurality of metal layers 13 and metal patterns for signal routing. Power supply lines are also formed using the metal layers 13. The active regions and gates of a transistor are coupled to the pads 14 and 15 through metal patterns and vertical contacts. The conductive bumps 16 and 17 are formed on the pads 14 and 15 through a ball drop process or a screen print process, etc and the formed bumps 16 and 17 are heated and reflowed to enhance electrical connections between the bumps 16 and 17 and the pads 14 and 15.

Referring to FIGS. 25 and 26, an ESD protection circuit ESDP is integrated in the substrate region 10, the epitaxial region 11 and the upper region 12 between the power voltage bump 16 and the ground voltage bump 17 to protect an internal circuit INT from the ESD event.

The ESD protection circuit ESDP is implemented using a lateral diode having a high breakdown voltage. The ESD protection circuit ESDP is fabricated using a process for fabricating an LDMOS transistor. The ESD protection circuit ESDP of FIG. 14 has a configuration such that the diode Dg is used for the gate coupling of the N-type LDMOS transistor NLDMOS. Also the diode Dg is used in the silicon controlled rectifier (SCR) circuit or the other various circuits having a high voltage input.

Figure 27:
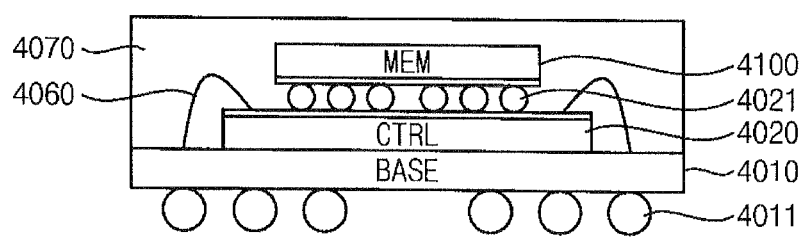
FIGS. 27 and 28 are diagrams illustrating a semiconductor packages according to exemplary embodiments.
Figure 28:
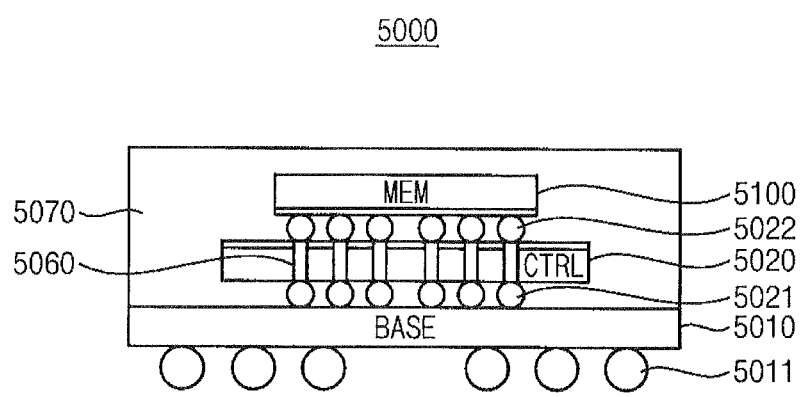

FIGS. 27 and 28 are diagrams illustrating a semiconductor package according to an exemplary embodiment of the present inventive concept.

Referring to FIG. 27, a semiconductor package 4000 includes a base substrate (BASE) 4010, a controller chip (CTRL) 4020 disposed on the base substrate 4010, and at least one semiconductor memory chip (MEM) 4100 disposed on the controller chip 4020. The base substrate 4010 may be a printed circuit board, and the controller chip 4020 may include a microprocessor unit (MPU). After the chips 4010, 4020 and 4100 are stacked on each other, the upper portion of the semiconductor package 4000 is covered with resin 4070.

The semiconductor memory chip 4100 and the controller chip 4020 are electrically connected to each other through the input-output bumps 4021 that are formed on the semiconductor memory chip 4100. The controller chip 4020 and the base substrate 4010 are electrically connected to each other using wires 4060. Bumps 4011 for electrical connection to an external device are formed under the bottom surface of the base substrate 4010.

The semiconductor memory chip 4100 and/or the controller chip 4020 include an ESD protection circuit as disclosed herein. The ESD protection circuit protects the internal circuits from ESD events that may occur through the bumps 4011 exposed to the external.

Referring to FIG. 28, a semiconductor package 5000 includes a base substrate (BASE) 5010, a controller chip (CTRL) 5020 disposed on the base substrate 5010, and at least one semiconductor memory chip (MEM) 5100 disposed on the controller chip 5020. The base substrate 5010 may be a printed circuit board, and the controller chip 5020 may include a microprocessor unit (MPU). After the chips 5010, 5020 and 5100 are stacked on each other, the upper portion of the semiconductor package 5000 is covered with resin 5070.

The semiconductor memory chip 5100 and the controller chip 5020 are electrically connected to each other through the input-output bumps 5022 that are formed on the semiconductor memory chip 5100. The controller chip 5020 and the base substrate 5010 are electrically connected to each other using bumps 5021 that are formed under the bottom surface of the controller chip 5020. The controller chip 5020 includes through-silicon Vias 5060 to reduce interfacing resistance between the base substrate 5010 and the controller chip 5020, compared with the wire bonding of FIG. 27. Bumps 5011 for electrical connection to an external device is formed under the bottom surface of the base substrate 5010.

The semiconductor memory chip 5100 and/or the controller chip 5020 include an ESD protection circuit as disclosed herein. The ESD protection circuit protects the internal circuits from ESD events that may occur through the bumps 5011 exposed to the external.

An ESD protection circuit including a diode fabricated using a process for LDMOS may be applied to various devices or systems where the protection of the internal circuit from an ESD event of the high voltage is required. Particularly the diode and the ESD protection circuit is usefully applied to the device and systems that receive the high voltage from the external power supply device.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A diode, the diode comprising:
an N-type well region disposed in an N-type epitaxial layer;
a P-type drift region disposed in the N-type epitaxial layer, wherein the P-type drift region is spaced apart from the N-type well region;
a cathode electrode including a first electrode and an N-type doping region, wherein the N-type doping region is electrically coupled to the first electrode, the N-type well region includes the N-type doping region only and does not include a P-type doping region, and the first electrode is disposed on the N-type epitaxial layer;
an anode electrode including a P-type doping region, wherein the P-type doping region is disposed in the P-type drift region; and
an isolation structure disposed in the P-type drift region, wherein the isolation structure is disposed between the N-type well region and the P-type doping region,
wherein the first electrode of the cathode overlaps part of the isolation structure,
wherein the first electrode corresponds to a gate of a P-type LDMOS transistor,
wherein the N-type well region, the P-type drift region, the P-type doping region, and the isolation structure of the diode corresponds to an N-type well region, a P-type drift region, a drain region, and an isolation structure of a P-type LDMOS transistor, respectively.

2. The diode of claim 1, further comprising:
an interlayer dielectric disposed on the first electrode and the N-type epitaxial layer,
a first vertical contact penetrating the interlayer dielectric layer and coupled to the N-type doping region;
a second vertical contact spaced apart from the first vertical contact and penetrating the interlayer dielectric layer and coupled to the N-type doping region;
a third vertical contact penetrating the interlayer dielectric layer and coupled to the first electrode;
a fourth vertical contact penetrating the interlayer dielectric layer and coupled to the P-type doping region; and
a second electrode disposed on the interlayer dielectric layer and coupled to the first electrode, the first vertical contact, and the second vertical contact.

3. The diode of claim 2,
wherein the first electrode of the cathode electrode is doped with an N-type dopant.

4. The diode of claim 1,
wherein a P-type doping region corresponding to a source region of the P-type LDMOS transistor is not disposed in the N-type well region, and
wherein the N-type doping region of the cathode is extended to a region corresponding to the source region of the P-type LDMOS transistor.

5. The diode of claim 1, wherein the N-type epitaxial layer is disposed on a semiconductor substrate.

6. The diode of claim 5, further comprising:
a P-type well region disposed in the N-type epitaxial layer, wherein the P-type drift region is disposed in the P-type well region.

7. The diode of claim 5, further comprising:
an N-type buried layer disposed in an upper portion of the semiconductor substrate,
wherein the N-type epitaxial layer is disposed on the N-type buried layer.

8. An electrostatic discharge (ESD) protection circuit comprising:
an N-type lateral diffused metal oxide semiconductor (LDMOS) transistor including a gate, a source electrode, and a drain electrode, wherein the source electrode is coupled to a first pad to which a first voltage is applied, and wherein the drain electrode is coupled to a second pad to which a second voltage higher than the first voltage is applied;
a diode comprising:
an N-type well region disposed in an N-type epitaxial layer;
a P-type drift region disposed in the N-type epitaxial layer, wherein the P-type drift region is spaced apart from the N-type well region;
a cathode electrode coupled to the second pad and including a first electrode and a first N-type doping region, wherein the first N-type doping region is electrically coupled to the first electrode, the first N-type doping region only is disposed in the N-type well region, and the first electrode is disposed on the N-type epitaxial layer;
an anode electrode coupled to the gate of the N-type LDMOS transistor and including a first P-type doping region, wherein the first P-type doping region is disposed in the P-type drift region; and
an isolation structure disposed in the P-type drift region, wherein the isolation structure is disposed between the N-type well region and the first P-type doping region,
wherein the first electrode of the cathode overlaps part of the isolation structure,
wherein the first electrode corresponds to a gate of a P-type LDMOS transistor,
wherein the N-type well region, the P-type drift region, the first P-type doping region and the isolation structure of the diode corresponds to an N-type well region, a P-type drift region, the drain electrode and an isolation structure of a P-type LDMOS transistor, respectively; and
a resistor having a first terminal that is coupled to the gate of the N-type LDMOS transistor and a second terminal that is coupled to the first pad.

9. The ESD protection circuit of claim 8, further comprising:
an interlayer dielectric disposed on the first electrode and the N-type epitaxial layer,
a first vertical contact penetrating the interlayer dielectric layer and coupled to the first N-type doping region;
a second vertical contact spaced apart from the first vertical contact and penetrating the interlayer dielectric layer and coupled to the first N-type doping region;
a third vertical contact penetrating the interlayer dielectric layer and coupled to the first electrode;
a fourth vertical contact penetrating the interlayer dielectric layer and coupled to the first P-type doping region; and
a second electrode disposed on the interlayer dielectric layer and coupled to the first electrode, the first vertical contact, and the second vertical contact.

10. The ESD protection circuit of claim 8, wherein the diode is configured to apply an induction voltage to the gate when a voltage lower than a breakdown voltage of the diode is applied to the ESD protection circuit, the induction voltage being determined by a capacitance between the cathode electrode and the anode electrode, and
wherein the diode is configured to apply a division voltage to the gate when a voltage higher than the breakdown voltage is applied to the ESD protection circuit, the division voltage being determined by a ratio of a resistance of the resistor and an on-state resistance of the diode.

11. The ESD protection circuit of claim 8,
wherein the N-type LDMOS transistor further includes a first P-type well region and an N-type drift region,
wherein the source electrode includes a second N-type doping region and a second P-type doping region, the second N-type doping region and the second P-type doping region being formed in the first P-type well region, and
wherein the drain electrode includes a third N-type doping region formed in the N-type drift region.

12. The ESD protection circuit of claim 11,
wherein the N-type epitaxial layer is disposed on a semiconductor substrate.

13. The ESD protection circuit of claim 12,
wherein an N-type buried layer is disposed in an upper portion of the semiconductor substrate, and
wherein the diode and the N-type LDMOS transistor are disposed on the N-type buried layer.

14. The ESD protection circuit of claim 12,
wherein an N-type buried layer is disposed in a first upper portion of the semiconductor substrate,
wherein a P-type buried layer is disposed in a second upper portion of the semiconductor substrate,
wherein the diode is disposed on the N-type buried layer, and
wherein the N-type LDMOS transistor is disposed on the P-type buried layer.

15. The ESD protection circuit of claim 11,
wherein a first dielectric layer disposed under the first electrode of the diode is thicker than a second dielectric layer disposed under the gate of the N-type LDMOS transistor.

16. The ESD protection circuit of claim 13,
wherein a deep trench is disposed in a boundary region between the diode and the N-type LDMOS transistor, and
wherein the deep trench penetrates the N-type buried layer.

* * * * *